(12) United States Patent
Routkevitch et al.

(10) Patent No.: US 8,624,105 B2
(45) Date of Patent: Jan. 7, 2014

(54) ENERGY CONVERSION DEVICE WITH SUPPORT MEMBER HAVING PORE CHANNELS

(75) Inventors: Dmitri Routkevitch, Longmont, CO (US); Rikard A. Wind, Johnstown, CO (US)

(73) Assignee: Synkera Technologies, Inc., Longmont, CO (US)

( * ) Notice: Subject to any disclaimer, the term of this patent is extended or adjusted under 35 U.S.C. 154(b) by 543 days.

(21) Appl. No.: 12/772,913

(22) Filed: May 3, 2010

(65) Prior Publication Data

US 2010/0304204 A1    Dec. 2, 2010

Related U.S. Application Data

(60) Provisional application No. 61/174,577, filed on May 1, 2009.

(51) Int. Cl.
*H01L 31/00*    (2006.01)

(52) U.S. Cl.
USPC ...... 136/256; 136/263; 136/244; 250/370.01; 250/370.05

(58) Field of Classification Search
USPC ......... 136/263, 256, 244; 250/370.01, 370.05
See application file for complete search history.

(56) References Cited

U.S. PATENT DOCUMENTS

| | | | |
|---|---|---|---|
| 3,227,876 A * | 1/1966 | Ross | ............................ 250/371 |
| 6,649,824 B1 | 11/2003 | Den et al. | |
| 6,705,152 B2 | 3/2004 | Routkevitch et al. | |
| 6,852,920 B2 | 2/2005 | Sager et al. | |
| 6,946,197 B2 | 9/2005 | Yadav et al. | |
| 6,946,597 B2 | 9/2005 | Sager et al. | |
| 7,045,205 B1 | 5/2006 | Sager | |
| 7,087,833 B2 | 8/2006 | Scher et al. | |
| 7,462,774 B2 | 12/2008 | Roscheisen et al. | |
| 7,511,217 B1 | 3/2009 | Roscheisen et al. | |
| 7,605,327 B2 | 10/2009 | Roscheisen et al. | |
| 2002/0192441 A1 | 12/2002 | Kalkan et al. | |
| 2004/0003838 A1 | 1/2004 | Curtin | |
| 2004/0084080 A1 | 5/2004 | Sager et al. | |
| 2005/0045874 A1 | 3/2005 | Xiao et al. | |
| 2005/0098205 A1 * | 5/2005 | Roscheisen et al. | .......... 136/263 |
| 2005/0186342 A1 | 8/2005 | Sager et al. | |

FOREIGN PATENT DOCUMENTS

DE    2741954 A    3/1979

OTHER PUBLICATIONS

R.J. Nikolic et al., "Roadmap for High Efficiency Solid-State Neutron Detectors," Lawrence Livermore National Laboratory, Optics East (UCRL-PROC-213583), Oct. 24, 2005-Oct. 27, 2005.

(Continued)

*Primary Examiner* — Zachary Best
(74) *Attorney, Agent, or Firm* — Marsh Fischmann & Breyfogle LLP

(57) ABSTRACT

Energy devices such as energy conversion devices and energy storage devices and methods for the manufacture of such devices. The devices include a support member having an array of pore channels having a small average pore channel diameter and having a pore channel length. Material layers that may include energy conversion materials and conductive materials are coaxially disposed within the pore channels to form material rods having a relatively small cross-section and a relatively long length. By varying the structure of the materials in the pore channels, various energy devices can be fabricated, such as photovoltaic (PV) devices, radiation detectors, capacitors, batteries and the like.

19 Claims, 11 Drawing Sheets

(56) References Cited

OTHER PUBLICATIONS

Krishnan Rajeshwar et al., "Semiconductor-Based Composite Materials: Preparation, Properties, and Performance," Department of Chemistry and Biochemistry, The University of Texas (Chem. Mater. 2001, 13, 2765-2782), Mar. 19, 2001.

Gabriel Gache, "Latest LED Crop Packs Nanowires," Softpedia (http://news.softpedia.com), Mar. 24, 2008.

Kris A. Bertness et al., "A Brighter Future From Gallium Nitride Nanowires," National Institute of Standards and Technology, pp. 9-12, Oct. 2006.

\* cited by examiner (a)

(b)

(a)

(b)

ENERGY CONVERSION DEVICE WITH SUPPORT MEMBER HAVING PORE CHANNELS

CROSS-REFERENCE TO RELATED APPLICATIONS

This application claims priority to U.S. Provisional Patent Application Ser. No. 61/174,577 filed on May 1, 2009, which is incorporated herein by reference in its entirety.

STATEMENT REGARDING FEDERALLY-FUNDED RESEARCH

This invention was funded by the National Science Foundation under Grant No. IIP-0638104, by the Department of Energy under Grant No. DE-FG02-07ER84871, and by the Department of Homeland Defense under Grant No. HSHQDC-07-C-00113 all administered by the Small Business Innovation Research (SBIR) program. The Government has certain rights in this invention.

BACKGROUND OF THE INVENTION

1. Field of the Invention

The present invention relates to the field of energy devices, such as energy conversion devices and energy storage devices. The devices can include a porous support member having pore channels, and one or more active material layers coaxially disposed within the pore channels. The devices can be utilized in a variety of applications including, but not limited to, energy conversion applications such as photovoltaics, photocatalysis, radiation detection and light emission, and energy storage devices such as capacitors and batteries.

2. Description of Related Art

There are many useful applications of energy conversion devices, i.e., devices that convert one form of energy (e.g., light or radiation) to another form of energy (e.g., electricity). By way of example, energy conversion devices may include photovoltaic cells, radiation detectors, photocatalysis devices, light emitting diodes and other lighting devices, and chemical or biological sensors. Similarly, there are many useful applications of energy storage devices such as electrical capacitors, batteries and the like.

One of the most promising and important areas of energy conversion technologies is the conversion of solar energy into electricity using photovoltaic (PV) materials. Most PV devices are formed using a semiconductor p-n junction for energy conversion. On absorption of light, electrons are excited into the conduction band and flow from a p-type semiconductor material to an n-type semiconductor material, while the holes in the valence band flow in the opposite direction. The calculated maximum conversion efficiency for an optimal p-n junction PV device with a band gap energy of 1.3 eV is about 31%.

One of the processes that limits the efficiency of the conversion of solar energy into electricity in PV devices is thermalization loss due to the electron-hole pair quickly losing energy to the creation of phonons. Another loss process is recombination of the electron-hole pairs, which can be reduced by using photovoltaic materials with high lifetimes for the photo-generated carriers, or by reducing the path length of the carrier to the p-n junction.

Thermalization loss can be largely eliminated if the energy of the absorbed photon is slightly higher than the band gap energy. For example, in the multijunction solar cell concept, the solar cell includes multiple p-n junctions in a stack that are each utilized to convert a narrow range of photon energies closest to its band gap energy with the highest band gap energy material being placed uppermost towards the light source and the remaining junctions being placed in order of decreasing band gap. This design allows less energetic photons to pass through the upper layers and be absorbed in the lower layers. An infinite stack of independent cells has a calculated maximum conversion efficiency of about 67% for a non-concentrated solar spectrum. Commercial multijunction cells are designed with matched output currents so that they can be connected in series. While triple-junction solar cells have been developed with efficiencies approaching 30%, the required matching of lattice parameters and output current makes adding more junctions complex and prohibitively expensive.

Examples of nanostructured PV devices are described in U.S. Pat. No. 6,946,597 by Sager et al. and U.S. Pat. No. 7,462,774 by Roscheisen et al. Sager et al. describes a solar cell that includes a nanoporous medium and a conductive layer surrounding a polymeric light absorber, where the light absorber also acts as the conductor. In Roscheisen et al., an additional semiconductive layer is applied between the conductor and the polymer.

Another solar energy conversion approach involves using sunlight to split water into its component elements, oxygen and hydrogen, by means of photoelectrochemical cells. Several challenges remain to making this a viable technology. For example, most semiconductor materials are not durable in an aqueous environment, thus eliminating them as candidates for use in water-splitting. Single-element semiconductors, such as silicon and germanium, oxidize rapidly in water to form insulating oxides. Similarly, Group III-V semiconductors, such as the nitrides, are unstable in water and will rapidly oxidize. The only known semiconductors that are stable in water over long time periods are oxide-based semiconductors.

One of the most widely studied photoelectrochemical materials is titanium dioxide ($TiO_2$), which has been shown to split water. $TiO_2$ has excellent chemical stability when illuminated in an aqueous environment, and it has band edge energies well aligned with the $H_2$ and $O_2$ evolution reactions; however, its large band gap energy (3.0-3.2 eV) precludes absorption of most of the solar spectrum other than UV, thus limiting its efficiency. Attempts at using other oxides with smaller band gaps have been largely unsuccessful. For example, $Fe_2O_3$ has a band gap energy of 2.1 eV and is therefore ideal for water-splitting. However, iron has been shown to leach from the surface over time and the material therefore corrodes. While recent advances in $WO_3$ production show promise, its band gap energy of 2.6 eV is too large for efficient hydrogen production.

Recently, attempts have been made to modify the band gap of $TiO_2$ by doping it with other materials, and doping $TiO_2$ with nitrogen and with carbon has led to optical absorption at wavelengths as low as about 500 nm, corresponding to a band gap energy of about 2.3 eV. Furthermore, the carbon-doped $TiO_2$ showed a maximum photoconversion efficiency of 8.35% at an applied potential of 0.30 V.

Beyond their large band gaps, one of the key limitations to using oxide semiconductors such as $TiO_2$ for photoelectrochemical materials are losses related to the short exciton diffusion length, i.e., the path length for the exciton to recombine.

Similar limitations are also inherent to particle or radiation detectors. In these devices, a large absorption cross-section is required to absorb a charged particle, but a thin semiconductor is desired to reduce recombination losses of the exciton.

Neutrons are uncharged particles, thus they cannot be detected directly. In order to detect fast neutrons, such as the prompt neutrons released during active interrogation, detectors commonly employ elastic neutron scattering by hydrogen as a detection mechanism. The scattering transfers a portion of the neutron kinetic energy to the hydrogen nucleus resulting in a recoil proton. The fraction of energy transferred ranges between zero and the full neutron energy and the average recoil proton has half of the original neutron energy. This allows for the preferential detection of fast neutrons in the presence of gamma-rays. With techniques such as pulse shape or rise time discrimination to eliminate gamma-ray events, proton recoil detectors can be used to detect a neutron energy as low as 1 keV. Recoil detectors are insensitive to thermal neutrons.

Alternatively, thermal neutrons are detectable through secondary charged particles (e.g., alpha particles) generated when they are absorbed by specific converter materials. A well-known example of a converter material is $^{10}$B, which is an alpha-converter with a thermal neutron microscopic absorption cross-section of 3840 barns. The cross-section is significantly lower for high energy, fast neutrons; however, a moderator such as high density polyethylene can be used to reduce the energy of the neutrons to the optimal detection energy. Due to its large absorption cross-section, $^{10}$B has been widely investigated as a neutron conversion material. $^{10}$B is a naturally occurring isotope with an abundance of about 20%. Thermal neutrons react with $^{10}$B by the following reaction.

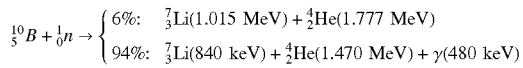

The high-energy alpha particles created by this reaction have a propagation range in $^{10}$B of only about 3.3 µm.

The alpha particles generated in the above reaction are detectable if they interact with a semiconductor p-n junction, where they create electron-hole pairs inside the junction, which are swept into an external circuit. Due to the large energies of the generated alpha particles, many electron-hole pairs are created. For example, if the alpha-particle deposits 1 MeV of energy into silicon (band gap energy of 3.6 eV), approximately 300,000 electron-hole pairs will be created. Conversion of a single neutron into an amplified current signal is the principle on which detectors are designed.

Unfortunately, solid state neutron detectors are inherently sensitive to gamma radiation. Gamma radiation is capable of penetrating many materials and thus is able to reach the depletion zone of the p-n junction, where it can be absorbed to create an electron-hole pair. Since this is the same mechanism by which neutrons are detected, gamma radiation can cause false positives. Comparing the detector signal with the signal from a second reference device, which does not contain the neutron converter material, normally eliminates these false positives.

Traditionally, solid state neutron detectors are fabricated in a planar configuration by coating a layer of $^{10}$B-based alpha-converter material onto a planar semiconductor. These devices have limited efficiency due to the conflicting thickness requirements of the converter material. The converter material must be thick enough to capture all the incoming neutrons, while at the same time being thin enough to allow the alpha particles to reach the semiconductor.

Nikolic et al. have proposed that these conflicting thickness requirements can be eliminated by changing the device architecture from a planar configuration to a 3-dimensional configuration. In this regard, FIG. 1 illustrates a proposed 3-dimensional configuration for a solid-state neutron detector. The solid-state neutron detector 100 includes rods 102 of boron disposed within a p-type semiconductor layer 104 and an intrinsic semiconductor layer 108. An n-type semiconductor layer 106 is used to form a backside ohmic contact. Metal layers 110 and 112 form electrical contacts to complete the structure.

Monte Carlo simulations of detectors with a 3-dimensional architecture have been performed and suggest that much higher detection efficiencies can be achieved. One architecture that was modeled consisted of a semiconducting material with an array of etched holes filled with $^{10}$B. The simulations showed that the largest detection efficiency was obtained for the smallest cell dimension that was modeled (2 µm). The simulations also showed that efficiency increased as the fraction of the cell occupied by $^{10}$B increases. Another architecture that was modeled consisted of an array of semiconducting pillars embedded in a $^{10}$B matrix. These simulations showed that as the pillar diameter and spacing was decreased, the detection efficiency increased. For example, 50 µm tall, 100 nm diameter pillars with a 100 nm separation can give a detector efficiency near 90%. The simulations also suggest that as the pillar size is further reduced below 100 nm, the detector efficiency can approach 100%.

While a 3-dimensional neutron detector such as that illustrated in FIG. 1 is expected to show dramatic improvements compared to a planar detector, a number of performance limitations still exist. First, the semiconductor layers must be at least as thick as the $^{10}$B layer (i.e., tens of µm). Since the minority carriers created by the alpha particle must travel through the thick semiconductor layer to reach the electrode, the semiconductor must be of high quality (i.e., high cost) in order to avoid recombination losses. However, exposure to ionizing radiation damages semiconducting materials, and consequently the performance of the device can be expected to degrade over time. Second, in order to obtain the highest sensitivity, the aspect ratio of the $^{10}$B pillars should be 500 or greater. This aspect ratio is very challenging to fabricate in silicon by micromachining, leading to high production costs. Third, the thickness of the depletion layer must be comparable to the thickness of the $^{10}$B layer, and therefore the bias voltage must be large, leading to large power consumption. The larger bias voltage will limit the utility of the solid state neutron detectors for low power applications, such as shipping container monitoring.

The foregoing energy conversion devices function by taking an energy input (e.g., light, radiation) and converting it to an electrical current; however, the opposite process is governed by similar architectural constraints. A light emitting diode (LED) is a semiconductor diode that emits light when the p-n junction is forward biased. In LEDs the light emits within a narrow spectrum, which produces the distinct colors seen for LEDs. Initially restricted to red light, and later extended to yellow, shorter wavelength LEDs have become available, such as blue LEDs based on GaN and InGaN.

Recently, LEDs have been fabricated based on AlGaN and AlInGaN with wavelengths extending below 230 nm, potentially enabling deep UV LEDs with wavelengths below 280 nm and high quantum efficiencies. These LEDs are all based on multiple quantum well (MQW) structures. MQWs are layers of slightly different materials deposited one on top of the other. For example, a 5-period AlN/Al$_{0.85}$Ga$_{0.15}$N with a well thickness of 20 Å was shown to emit light at about 230 nm. MQW structures such as these have unequivocally demonstrated the path to generate deep UV from LEDs.

SUMMARY OF THE INVENTION

Accordingly, it has been found that arrays of aligned material rods (e.g., material layers deposited within arrays of pore channels) having a relatively small diameter and a high aspect ratio may advantageously increase the efficiency of energy conversion devices and energy storage devices and may reduce losses in such devices. Further, the material rods may have reduced layer strain as compared to conventional thin film devices. Reduced strain between layers can reduce the number of dislocations in the material layers and may enable the creation of some material compositions that are difficult or impossible to attain in traditional thin film structures.

It is one objective to provide arrays of coaxial multilayered material rods (e.g., nanorods) using deposition methods to deposit material layers within pore channels. The coaxial multi-layered rods may advantageously have few inherent scaling or integration problems, enabling low-cost high-efficiency energy conversion devices and energy storage devices that can be implemented on a large scale.

In view of the foregoing it is one objective to provide an energy device comprised of a support member having an array of pore channels that contain coaxially disposed layers of materials to form rods or tubes (e.g., nanorods or nanotubes) of the materials within the pore channels. In one aspect, the array of pore channels can include one or more material layers with a compositional gradient along the length of the pore channel. It is another objective to provide arrays of pore channels that include one or more material layers having a thickness gradient along the length of the pore channels. The resulting composition and/or thickness gradients can lead to desirable material property gradients, such as an energy band gap gradient, to increase the efficiency of energy conversion. It is another objective to provide an energy conversion device that is capable of efficiently converting radiation, such as sunlight, to electricity. It is another objective to provide an energy conversion device that is capable of efficiently converting a broader range of the light spectrum to electricity using a vertically graded band gap. It is another objective to provide an energy conversion device that is capable of converting radiation into chemical energy, such as photoelectrochemically splitting water into hydrogen and oxygen. It is another objective to provide an energy conversion device that is capable of efficiently detecting radiation, such as alpha particles, beta particles, neutrons, and photons. It is another objective to provide an energy conversion device that is capable of producing light from electricity, e.g., a light emitting diode. It is another objective to provide an energy storage device, such as capacitor or battery.

One or more of the foregoing objectives may be realized by one or more of the various embodiments of the present invention, which in one aspect provide a device comprising a support member having pore channels and one or more material layers coaxially disposed within the pore channels of the support member, forming an array of material rods comprising coaxially disposed material layers.

According to one exemplary embodiment, an energy conversion device is provided. The energy conversion device may include a support member comprising an array of pore channels having an average pore diameter of not greater than about 10 µm and having a pore channel length. A plurality of material layers may be coaxially disposed along the length of the pore channels. The material layers may include a first conductor layer, a second conductor layer and an energy conversion layer. The first conductor layer may be coaxially disposed within a shell of the energy conversion layer and the energy conversion layer may be disposed within a shell of the second conductor layer. In this manner, the transport distance (e.g., for charge carriers) from the energy conversion layer to the first and second conductor layers may be very short, e.g., on the order of nanometers.

A number of feature refinements and additional features may be separately applicable to the foregoing embodiment. These feature refinements and additional features may be implemented individually or in any combination. In one aspect, the support member is an anodic metal oxide, such as aluminum oxide. In another aspect, the average pore channel diameter is at least about 1 nm and is not greater than about 1000 nm and the pore channel length is at least about 0.1 µm and is not greater than about 500 µm. The material layers, such as the energy conversion layer, may have a thickness of at least about 1 nm and that is not greater than about 200 nm. To provide a high areal density of material rods, the support member may have a pore channel density of at least about $10^8$ pore channels per $cm^2$, and in one aspect the pore channel density may be not greater than $10^{10}$ pore channels per $cm^2$. The pore channels may extend through the support member.

The conductor layers and energy conversion layer may comprise various active materials. For example, the first conductor layer may comprise a hole conductor material and the energy conversion layer may comprise a p-type semiconductor material. In one aspect, the energy conversion layer may include at least a first energy conversion material and a second energy conversion material, such as a p-type semiconductor and an n-type semiconductor. In this regard, the first energy conversion material may be coaxially disposed within a shell of the second energy conversion material, or vice versa. The second conductor layer may include an optically transparent electrically conductive material, thereby enabling substantially the entire length of the material rod to be exposed to radiation, such as sunlight. In this regard, the energy conversion layer may comprise a p-n junction that is disposed between the second conductor layer and the first conductor layer. Alternatively, the energy conversion layer may include a Schottky junction disposed between the second conductor layer and the first conductor layer. The energy conversion device may be a photovoltaic device.

According to another aspect, the energy conversion device may be a radiation detector, such as where the plurality of material layers includes a neutron converter layer disposed within a shell of the first conductor layer.

Further, the energy conversion device may be a lighting device such as a light emitting diode (LED). In this regard, the energy conversion layer may include a layer of n-type semiconductor and a layer of p-type semiconductor where the second conductor layer may be an optically transparent electrically conductive material. Alternatively, the energy conversion layer may include multiple quantum well structures.

According to another embodiment, an energy storage device is provided. The energy storage device may include an insulating support member having an array of pore channels having a pore channel diameter of not greater than about 10 µm and having a pore channel length. A plurality of material layers may be coaxially disposed along the length of the pore channels. The material layers may include a first electrical conductor layer, a second electrical conductor layer, and a separation layer comprising a material selected from a dielectric material and an electrolyte, where the first conductor layer is coaxially disposed within a shell of the separation layer and the separation layer is disposed within a shell of the second conductor layer.

A number of feature refinements and additional features may be separately applicable to the foregoing embodiment. These feature refinements and additional features may be implemented individually or in any combination. In one aspect, the average pore channel diameter may be at least about 1 nm and not greater than about 1000 nm and the pore channel length may be at least about 0.1 µm and not greater than about 500 µm. The separation layer may be extremely thin, such as a separation layer having a thickness of at least about 1 nm and not greater than about 200 nm. The insulating support member may have a pore channel density of at least about $10^8$ pore channels per $cm^2$, and not greater than about $10^{10}$ pore channels per $cm^2$.

According to one aspect, the separation layer comprises a dielectric material, such as where the energy storage device is a capacitor. In another aspect, the separation layer comprises an electrolyte, such as where the energy storage device is an electrochemical capacitor or is a battery.

According to another embodiment, an energy conversion device having a graded (e.g., vertically graded) material property is provided. The energy conversion device may include an insulating support member comprising an array of pore channels having an average pore diameter of not greater than about 10 µm and having a pore channel length. A plurality of material layers are coaxially disposed within the pore channels, where the material layers comprise at least a first energy conversion layer. A material property of the first energy conversion layer varies in a controlled manner along the pore channel length.

A number of feature refinements and additional features may be separately applicable to the foregoing embodiment. These feature refinements and additional features may be implemented individually or in any combination. In one aspect, the band gap energy of the first energy conversion layer varies in a controlled and substantially continuous manner along the pore channel length. In another aspect, the material composition of the first energy conversion layer varies in a controlled and substantially continuous manner along the pore channel length. For example, the first energy conversion layer may include a material such as an n-type semiconductor, a p-type semiconductor, an absorbent material, or combinations thereof. For example, the energy conversion layer may include a first energy conversion material and a second energy conversion material, such as an n-type semiconductor and a p-type semiconductor. In this regard, a material property of one of the energy conversion materials may vary in a controlled and substantially continuous manner along the length of the pore channels.

According to another aspect, the plurality of material layers may include a first conductor layer that is coaxially disposed within the energy conversion layer. The plurality of material layers may also include a conductor layer comprising an optically transparent conductive material, wherein the first energy conversion layer is disposed within a shell of the optically transparent conductive material. The energy conversion device may be a photovoltaic device, a radiation detector, a photocatalysis device or a light emitting diode.

According to another embodiment, a photocatalysis device is provided. The photocatalysis device may include a support member comprising an array of pore channels, e.g., having an average pore diameter of not greater than about 10 µm and having a pore channel length. A plurality of material layers may be coaxially disposed within the pore channels. The material layers may include a photoelectrochemical layer that forms an exposed tube for the receipt of a reactant. A first energy conversion layer may be provided, where the photoelectrochemical layer is coaxially disposed within a shell of the first energy conversion layer. The energy conversion layer may then be coaxially disposed within a shell of a conductor layer, such as where the conductor layer comprises an optically transparent conductor.

A number of feature refinements and additional features may be separately applicable to the foregoing embodiment of a photocatalysis device. These feature refinements and additional features may be implemented individually or in any combination. In one aspect, the photoelectrochemical layer may include a metal oxide, such as titanium oxide, iron oxide or tungsten oxide. In another aspect, the exposed tubes may have an inner diameter of at least about 20 nm and not greater than about 500 nm. In yet another aspect, the energy conversion layer may have a thickness of at least about 1 nm and not greater than about 20 nm.

According to another embodiment, a method for the fabrication of an energy conversion device is provided. The method may include providing a support member comprising an array of pore channels, where the pore channels have an average pore diameter of not greater than about 10 µm and have a pore channel length. The method may include depositing at least a first material layer within the pore channels to coat an interior surface of the pore channels and form a first material layer within the pore channels, where the first material layer comprises a first conductive material. The method may also include depositing a second material layer within the first material layer, wherein the second material layer is coaxially disposed within the first material layer. The second material layer may include a first energy conversion material. A third material layer may then be deposited within the second material layer, where the third material layer is coaxially disposed within the second material layer and wherein the third material layer comprises a second conductive material. The second conductive material may be the same or different than the first conductive material.

According to one aspect, the first conductive material may be an optically transparent conductive material, such as an optically transparent conductive metal oxide. According to another aspect, the first energy conversion material may be a semiconductor or an absorber material. In yet another aspect, the step of depositing the second material layer may include varying the composition of the first energy conversion material along the length of the pore channels.

According to various aspects, the material layers may be deposited by methods such as atomic layers deposition (ALD), chemical vapor deposition (CVD), electroless deposition, electrochemical methods, sol-gel deposition, and the like. The depositing steps may also include reacting at least one material layer with a gas phase reagent.

DESCRIPTION OF THE INVENTION

Figure 1:
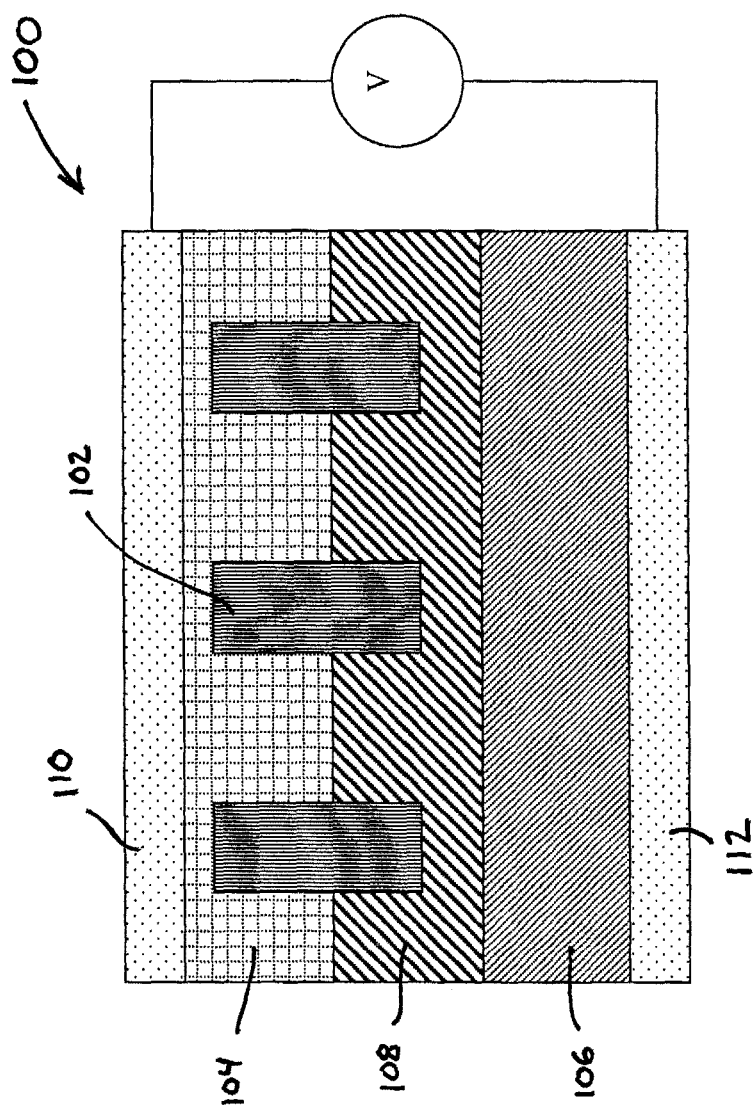
FIG. 1 illustrates a cross-section of a solid-state neutron detector.

The energy devices disclosed herein may include an array of high-density, high-surface-area material rods and/or tubes formed inside the pore channels of a support member such as anodic aluminum oxide (AAO). This approach can utilize a synergistic combination of two technologies: (1) synthesis and integration of a support member with the desired pore channel structure; and (2) conformal deposition of materials inside the pore channels to produce coaxially disposed material layers with precision engineered architecture and composition. Optionally, the devices may incorporate a variation of materials properties along the pore channel length, i.e., along the length of the material rods. This approach can advantageously provide the ability to absorb and convert radiation, for example, along the length of the material rods, while effectively separating charge carriers by moving them a short distance that is substantially orthogonal to the pore channel length. The approach also enables the formation of innovative gradients of material properties along the pore channel length, such as a gradient in band gap energy, to efficiently convert energy, for example to absorb radiation across a broad solar spectrum, leading to extremely high energy conversion efficiency.

The energy conversion devices and energy storage devices (collectively referred to herein as energy devices) include a support member having an array of pore channels disposed within the support member. Active material layers, e.g., layers of semiconductor materials and conductive materials, are deposited within the pore channels and are supported by the support member to form an array of material rods, e.g., having a high aspect ratio, comprised of coaxially disposed material layers.

The support member may be fabricated from a variety of materials including metal oxides, such as aluminum oxide ($Al_2O_3$) and titanium oxide ($TiO_2$). The support member is preferably an electrically insulative material such as an insulative metal oxide. For example, the support member can be an anodic aluminum oxide (AAO) substrate, which can include a high density of substantially uniform and substantially parallel pore channels extending into the substrate perpendicular to the substrate surface. AAO is formed by anodizing aluminum metal under controlled conditions to form the array of pore channels. Other materials that may be useful for the support member in addition to AAO include porous silica, track etch polymers, block copolymers, zeolites, aerogels or similar materials that may be fabricated to have an array of pore channels that are exposed on at least one side of the pore channel.

The average diameter of the pore channels may vary over a wide range. For example, the pore channel diameter may range from about 1 nm to about 10 μm. For the energy devices disclosed herein, the pore channels may advantageously have an average pore channel diameter of not greater than about 1000 nm, such as from about 5 nm to about 500 nm.

The thickness of the support member can also be varied, such as in a range of from about 0.1 μm to about 500 μm. A particularly useful thickness of the support member for the energy devices disclosed herein is in the range of at least about 10 μm to not greater than about 200 μm. The pore channels are exposed on at least one side of the support member, and the pore channels may be exposed on both sides of the support member, i.e., the pore channels may extend through the support member, in which case the length of the pore channels is substantially equal to the thickness of the support member. The support member can have a high density of pore channels to increase the areal efficiency of the energy device, such as from about $10^6$ pore channels per $cm^2$ up to about $10^{12}$ pore channels per $cm^2$. For example, in one embodiment the density of pore channels in the support member can be at least about $10^8$ pore channels per $cm^2$ and not greater than about $10^{10}$ pore channels per $cm^2$.

For anodized metal oxides (e.g., AAO), the average pore channel diameter may be controlled by controlling the anodization conditions such as the anodization current, anodization voltage, electrolyte concentration, anodization rate, and the like. Solutions of organic and inorganic acids may comprise the electrolyte. The electrolyte composition, temperature and anodization voltage may be varied depending on the desired parameters of the AAO support member, such as the thickness, pore channel diameter, pore density and surface area. An AAO substrate forming the support member can have pore channels open on at least one side of the substrate and may comprise pore channels extending through the substrate. The fabrication of AAO substrates is disclosed, for example, in U.S. Pat. No. 6,705,152 by Routkevitch et al. which is incorporated herein by reference in its entirety.

To form the energy devices, the pore channels of the support member can be wholly or partially filled with one or more material layers depending upon the type and application of the energy device, e.g. an energy conversion device such as a photovoltaic device or a radiation detector; or an energy storage device such as a capacitor, a battery or an electrochemical sensor. Material layers that are deposited wholly or partially within the pore channels of the support member are referred to herein as active material layers. The active material layers can include, but are not limited to, n-type semiconductor materials, p-type semiconductor materials, electronic conductors such as metals and electronically conductive metal oxides, including transparent conductive oxides (TCO), hole conductor materials, absorber materials, dielectric materials, ionic conductors, solid electrolytes and photoelectrochemical materials. In this regard, the active materials can include metals, ceramics, metal compounds such as metal oxides, metal nitrides and the like, as well as organic materials such as polymers, and combinations thereof.

Among the active material layers that can be deposited in the pore channels are energy conversion layers that include one or more energy conversion materials. Energy conversion materials are those active materials that are capable of converting one type of energy into another type of energy. Examples of such energy conversion materials include, but are not limited to, n-type semiconductors, p-type semiconductors, absorber materials and electrolytes. For example, the foregoing semiconductor materials, when used in combination, can convert light energy to electrical energy by creating electron-hole pairs from incident photons. Similarly, these semiconductor materials can also emit light when an electric field is applied to the materials. Absorber materials can also convert different types of incident energy such as incident neutrons by emitting a second type of energy, e.g., for use as a radiation detector. Other active materials may include electrode materials, electrolytes, and/or ionic conductors that can convert electrical energy into chemical energy and vice versa, enabling the fabrication of electrochemical capacitors, batteries, electrochemical sensors and fuel cells.

One category of such energy conversion materials are semiconductor materials. Semiconductor materials can be generally categorized as materials having an electronic band gap energy between about 0.5 eV and about 3.5 eV. Semiconductor materials can be metals (e.g., silicon based metals), metal compounds such as oxides, nitrides and the like, as well as polymers. The semiconductor materials can be p-type semiconductor materials. One example of a p-type semiconductor material is silicon doped with a trivalent atom such as boron or aluminum. Other examples include nitrides such as doped gallium nitride (GaN) and oxides such as doped ZnO.

The semiconductor material can also be an n-type semiconductor. An example of an n-type semiconductor is silicon doped with an element such as phosphorous, arsenic or antimony. Other examples of n-type semiconductors include doped GaN and oxides such as doped ZnO.

Absorber materials may include, for example, semiconductors such as GaN, InN, InGaN, CdTe, CdTeSe, CdSe, CdS, $Cu_2S$, $CuInS_2$, $CuInSe_2$, titanium oxide, ZnO and copper oxide.

The active material layers can also include electronic conductors that have good electronic conductivity, e.g., an electronic resistivity of not greater than about $5 \times 10^{-8}$ ohm·m. Examples of electronic conductors include, but are not limited to, metals such as copper, nickel, gold, silver, platinum and the like and some conductive metal oxides, such as aluminum-doped zinc oxide (ZnO), indium tin oxide (ITO), fluorine doped tin oxide, titanium oxide and tungsten oxide, as well as conductive polymers and conductive nitrides such as TiN.

Also included among the conductive materials that can be deposited into the pore channels are optically transparent electrical conductors, such as transparent conductive oxides having good electrical conductivity. An example of such a material is indium tin oxide (ITO).

Examples of hole conductors include, but are not limited to, metals such as gold, platinum and copper, as well as hole conducting polymers and metal nitrides such as TiN.

Further, the active material layers that can be deposited into the pore channels include separation materials. As used herein, separation materials include dielectric materials and electrolyte materials. Dielectric materials may be used for the fabrication of energy storage devices such as capacitors, wherein the dielectric material layer is disposed between conductive layers. The dielectric material may have a relative permittivity ($\epsilon_r$) of at least about 10, such as at least about 100. For example, the dielectric materials may include insulators such as metal oxides such as aluminum oxide, hafnium oxide, silicon oxide, tantalum oxide, titanium oxide, titanates such as strontium titanate, zirconium oxide, lanthanum oxide and other materials such as silicon nitride, hafnium silicate and zirconium silicate.

Separation materials may also include electrolytes that are disposed between conductive electrodes, and examples of electrolyte materials that can be deposited into the pore channels may include, for example, ceramics, polymers, gels holding salts and polyelectrolytes. Some examples include, but are not limited to, zirconium oxide, calcium and/or yttrium doped zirconium oxide, strontium titanate, beta-alumina, lanthanum fluoride, beta-lead fluoride, silver iodide, NAFION (a sulfonated tetrafluoroethylene based fluoropolymer-copolymer), lithium salts such as phosphate, perchlorate and other materials. Electrode materials (e.g., conductor layers surrounding the electrolyte) are typically cathode and anode materials, including but not limited to metals (such as aluminum, tantalum, gold, platinum, silver, zinc, lithium and others), metal oxides (such as manganese oxide, silver oxide, copper oxide, and others), carbon, activated carbon and graphitic layers, carbon nanotubes, diamond and diamond-like carbon.

The active material layers may also include photoelectrochemical layers that include a photoelectrochemical material, e.g., a material that can react photochemically and/or electrochemically with a reactant. Such layers may be fabricated into the shape of exposed tubes for the receipt of a reactant within the tube that may react with the photoelectrochemical layer. Examples of photoelectrochemical materials include metal oxides such as titanium oxide, iron oxide and tungsten oxide. Such materials can be utilized to fabricate a photocatalysis device, for example.

In various embodiments, the foregoing materials can be deposited (e.g., sequentially deposited) into the pore channels of the support member to form a plurality of coaxially disposed material layers, e.g., forming arrays of aligned rods of coaxially disposed active materials. Such arrays of material rods can be utilized for a variety of energy conversion devices, including but not limited to photovoltaic devices for converting solar radiation into electricity, radiation detectors, photocatalysis devices, light emitting diodes, chemical or biological sensors, or for energy storage devices such as capacitors and batteries.

Figure 2:
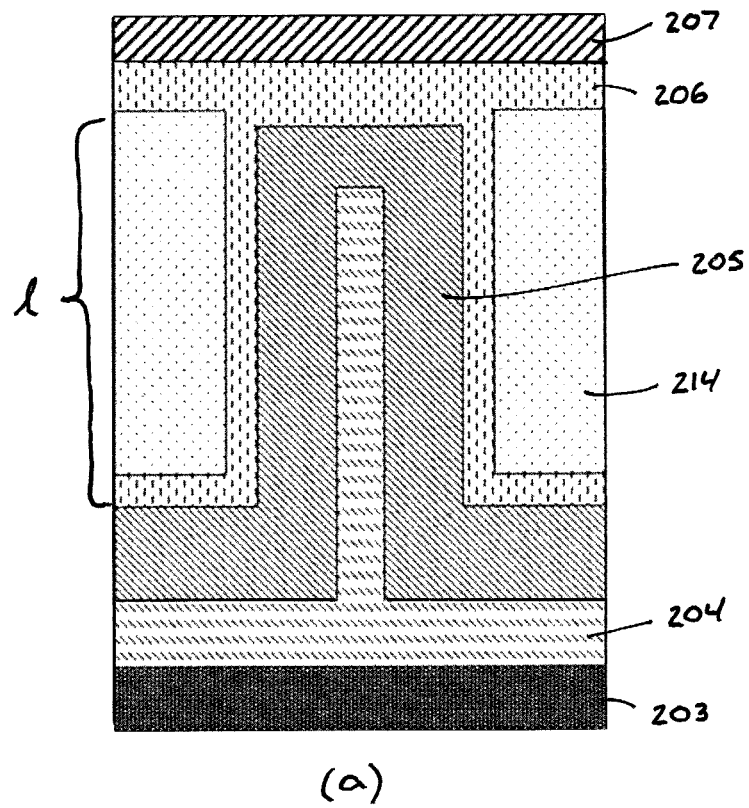
FIGS. 2a and 2b illustrate a cross-section of an energy conversion device according to an embodiment of the present invention.
Figure 2:
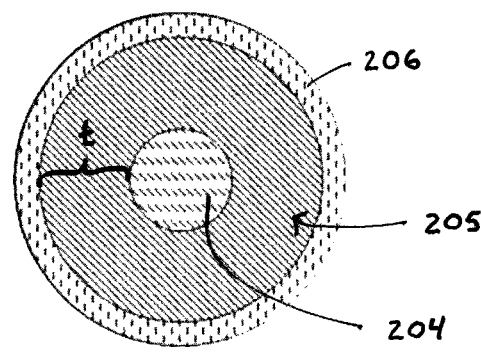

As is noted above, the energy devices may include a support member having a plurality of pore channels, e.g., a pore channel density of $10^6$ pore channels per $cm^2$ or more. A cross-section of a single pore channel is illustrated in FIG. 2, with FIG. 2(a) illustrating a side view of the pore channel and FIG. 2(b) illustrating a top view of the pore channel. The pore channel is contained within a porous support member 214, such as anodic aluminum oxide, and as illustrated in FIG. 2 extends though the support member 214. In this embodiment, a first conductor layer 204 forms a centrally disposed core within the pore channel that is surrounded by an energy conversion layer 205, e.g., the energy conversion layer 205 forms a shell around the first conductor layer 204 within the pore channel. The energy conversion layer 205 is in turn surrounded by a second conductor layer 206 that forms a shell around the energy conversion layer 205 within the pore channel.

As is discussed in more detail below, the energy conversion layer 205 may comprise one or more distinct material layers, such as an n-type semiconductor layer and a p-type semiconductor layer forming a p-n junction therebetween. Alternatively, the energy conversion layer 205 may comprise a single material layer, such as GaN.

For applications that require optical transparency between the energy conversion layer 205 and the surrounding environment, an optically transparent conductor material may be used as the second (e.g., outer) conductor layer 206 of the device. An additional planar conductor layer 207 may also include an optically transparent conductor material such as ITO that is disposed over the top of the second conductor layer 206 to permit incident light to impinge on the energy conversion layer 205 disposed in the pore channel, such that the light may impinge along substantially the entire length of the pore channel. An additional planar conductor layer 203 may also be disposed on the bottom of the first conductor layer 204. These additional planar conductor layers may be utilized to ensure that the charge carriers (electrons and holes)

can flow substantially unimpeded once they emerge from the material rods where they were generated.

Thus, if the energy conversion layer 205 is composed of two material layers that form a p-n junction, each individual p-n junction may be long in the direction of the incident light allowing for high absorption, but thin in an orthogonal direction (e.g., orthogonal to the pore channel length) enabling effective carrier separation. In this regard, the energy conversion layer 205 may have a thickness t of at least about 1 nm, and not greater than about 200 nm, for example not greater than about 20 nm, such as from about 5 nm to about 10 nm to provide a short distance for the carriers to migrate before reaching one of the conductor layers 204 or 206. However, as compared to the small thickness t, the energy conversion layer 205 may have a relatively long length l to increase the effective area of energy absorption or radiation. The length may be approximately equal to the thickness of the support member. For example, the length l of the energy conversion layer (e.g., the material rod) may be at least about 1 μm, such as from about 1 μm to about 200 μm. In one embodiment, the length of the energy conversion layer is from about 10 μm to about 200 μm. By way of further example, the aspect ratio of the energy conversion layer (l/t) may be at least about 100, such as at least about $10^4$.

To form an energy storage device, the energy conversion layer 205 may be replaced with a dielectric layer (e.g., a metal oxide such as aluminum oxide) to form a capacitor, or with an electrolyte layer (e.g., gelled electrolyte solution, metal salt or polyelectrolyte) to form an electrochemical capacitor or a battery.

Figure 3:
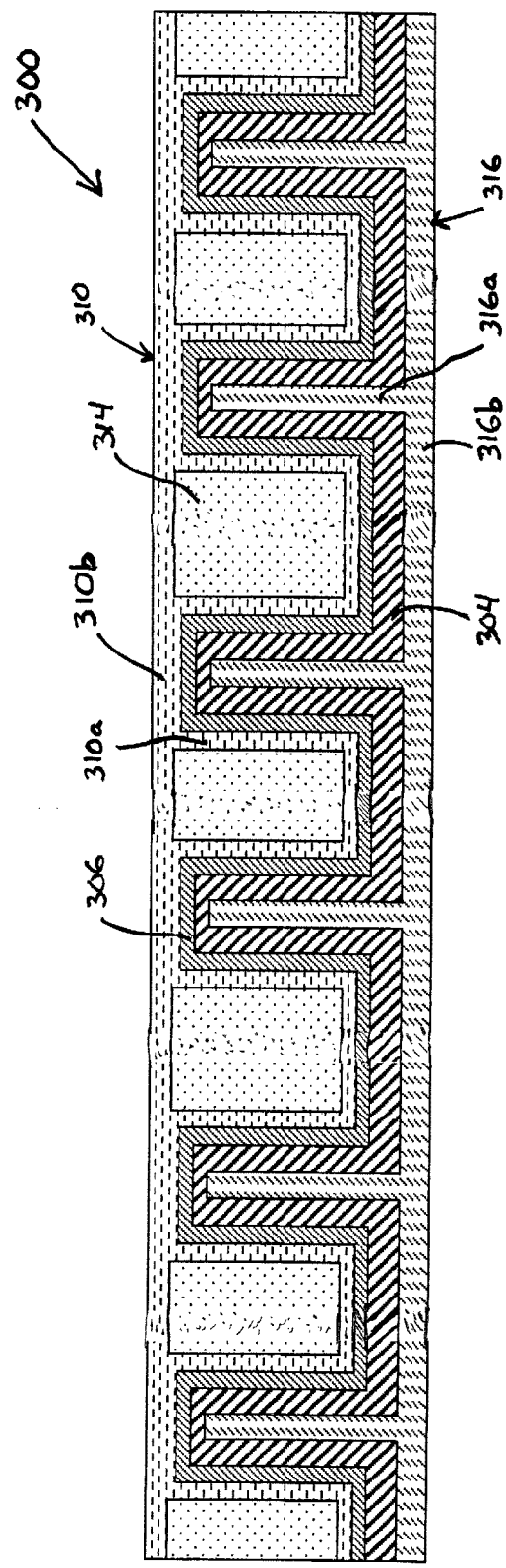
FIG. 3 illustrates a cross-section of an energy conversion device according to an embodiment of the present invention.

An example of an energy device is illustrated in FIG. 3. FIG. 3 is a cross-section of a plurality of pore channels in a support member 314, the pore channels having a plurality of material layers deposited therein to form a plurality of material rods, e.g., nanorods. As is illustrated in FIG. 3, the material rods each include a first conductor layer 316 that comprises a hole conductor material and forms a central core portion 316a. The central core portion 316a is coaxially disposed within a shell of an energy conversion layer 305. The energy conversion layer 305 comprises a layer of a p-type semiconductor 304 and a layer of an n-type semiconductor 306 surrounding the layer of p-type semiconductor 304, to form an energy conversion layer 305 including a p-n junction. A second conductor layer 310 comprising an optically transparent conductor material is disposed over the support member 314 and also comprises an optically transparent shell portion 310a surrounding the energy conversion layer 305, i.e., the p-n junction. As illustrated in FIG. 3, the first conductor layer 316 and the second conductor layer 310 each include a planar portion 316b and 310b that is integral with the coaxially disposed portions 316a and 316b and 310a within the pore channels, to interconnect the individual material rods in the array.

Figure 4:
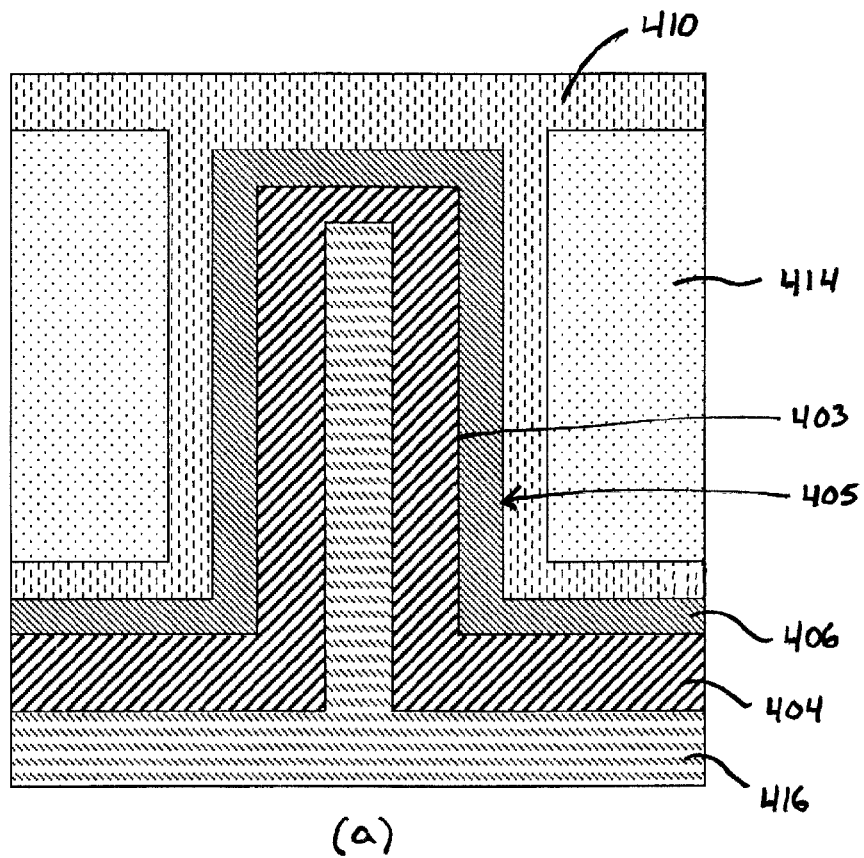
FIGS. 4a and 4b illustrate a cross-section of an energy conversion device according to an embodiment of the present invention.
Figure 4:
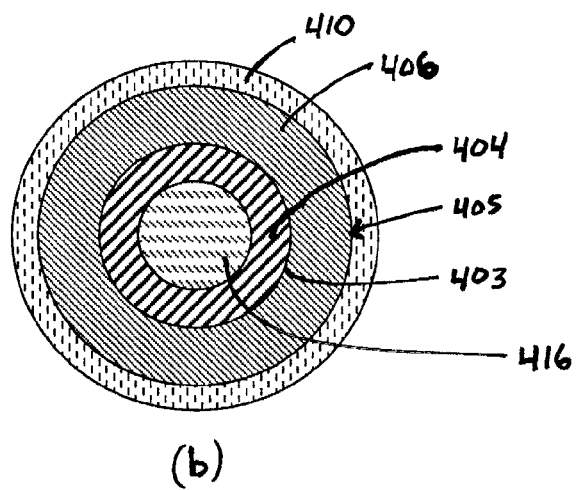

The structure of an individual material rod disposed within a pore channel is more clearly illustrated in FIG. 4, where FIG. 4(a) illustrates a cross-sectional side view of a single pore channel (e.g., a single material rod) and its surrounding structure and FIG. 4(b) illustrates a cross-sectional top view of the material rod. The central core is formed from a first conductor layer 416 that may comprise a hole conductor material. The first conductor layer 416 is coaxially disposed within an energy conversion layer 405 that forms a shell around the first conductor layer 416 within the pore channel. The energy conversion layer 405 includes a p-type semiconductor 404. The p-type semiconductor 404 itself is coaxially disposed within a layer of an n-type semiconductor 406 surrounding the p-type semiconductor and forming a p-n junction 403. A second conductor layer 410 comprising a transparent conductor material is disposed over the support member 414 and also extends downwardly into the pore channel forming a shell surrounding the energy conversion layer 405.

In this design, any defects (e.g., dislocations) in the semiconductor materials 404 and 406 are much less important to device efficiency, since the carriers (e.g., electrons and holes) have to diffuse only a very short distance before entering the conductor layers 410 and 416. Further, the optically transparent conductor 410 may increase device efficiency by extending along the length of the pore channel, enabling efficient charge separation.

This design, when used to convert solar radiation into electricity, can be expected to have an efficiency limited to 31% since only a single band gap energy is used to absorb a small portion of the solar spectrum.

Figure 5:
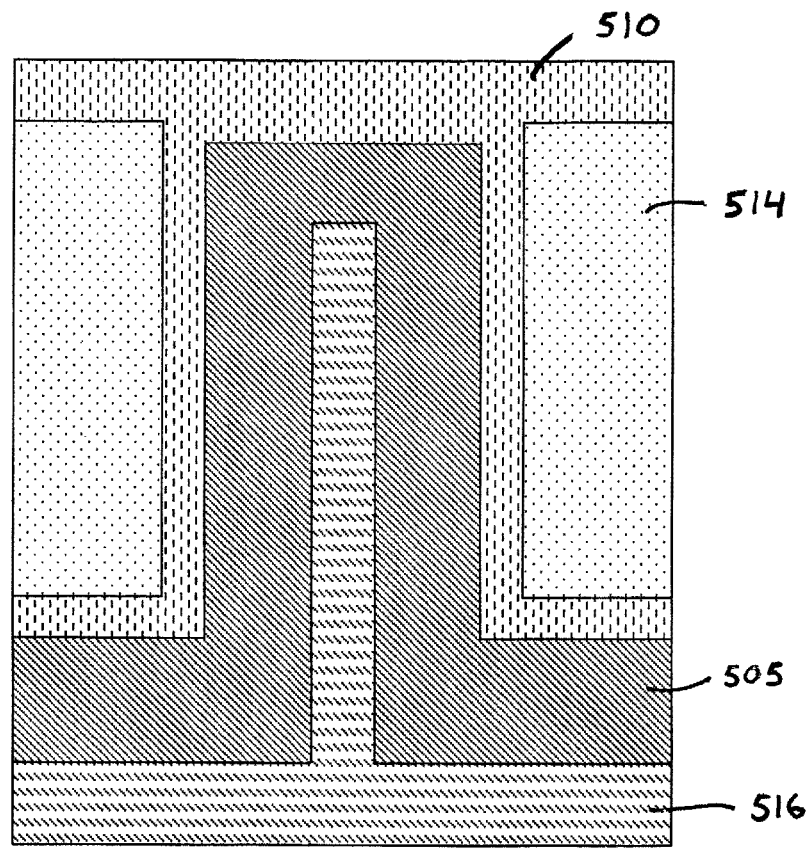
FIGS. 5a and 5b illustrate a cross-section of an energy conversion device according to an embodiment of the present invention.
Figure 5:
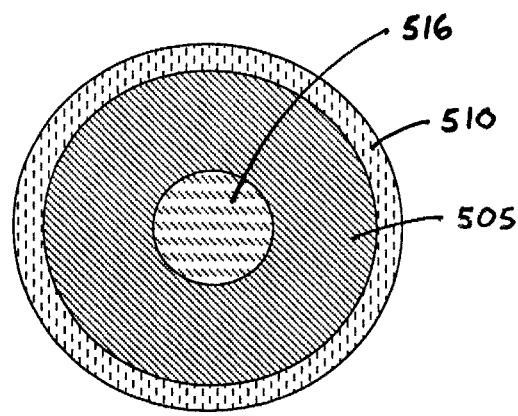

A related structure is illustrated in FIG. 5, where FIG. 5(a) illustrates a side view of a single pore channel (e.g., a material rod) and FIG. 5(b) illustrates a top view of the material rod. In this embodiment, the energy conversion layer 505 includes an absorber material that is disposed within the pore channel between a transparent conductor layer 510 and a hole conductor layer 516. The absorber material may be a material where the light absorption and charge transport are decoupled, such as a dye molecule semiconductor material. Other examples of such absorber materials include InGaN. An advantage of this structure as compared to known structures incorporating such materials is that the thin film of absorber allows generated charge carriers to rapidly enter the conductor layers in a substantially orthogonal direction to the length of the material rod while maintaining sufficient thickness in the vertical direction for substantially complete light absorption.

According to one embodiment, to reduce carrier thermalization losses, the pore channels can advantageously incorporate multijunctions. Instead of, or in addition to, creating multiple, radially layered p-n junctions, a vertically graded p-n junction or extremely thin absorber (ETA) layer can be formed within a pore channel. Since the vertical distance over which the band gap is graded along the pore channel (e.g., several microns) is much greater than the radial distance over which the carriers diffuse orthogonal to the pore channel (e.g., several nanometers), this structure is theoretically equivalent to vertically stacked multiple p-n junctions connected in parallel. This is highly beneficial in comparison with conventional multijunction photovoltaics, where the number of junctions is limited to 3 or 4 in practical implementations and where the junctions are connected in series, thus imposing limitations on the selection of materials and device efficiency due to the need to match the power loads of individual junctions. In some of the embodiments disclosed herein, the band gap energy can be varied substantially continuously along the length of the pore channel, which is equivalent to an unlimited number of junctions and therefore can result in more efficient absorption over a broader spectral range. Furthermore, parallel connection eliminates the need for power matching, simplifying the device.

Figure 6:
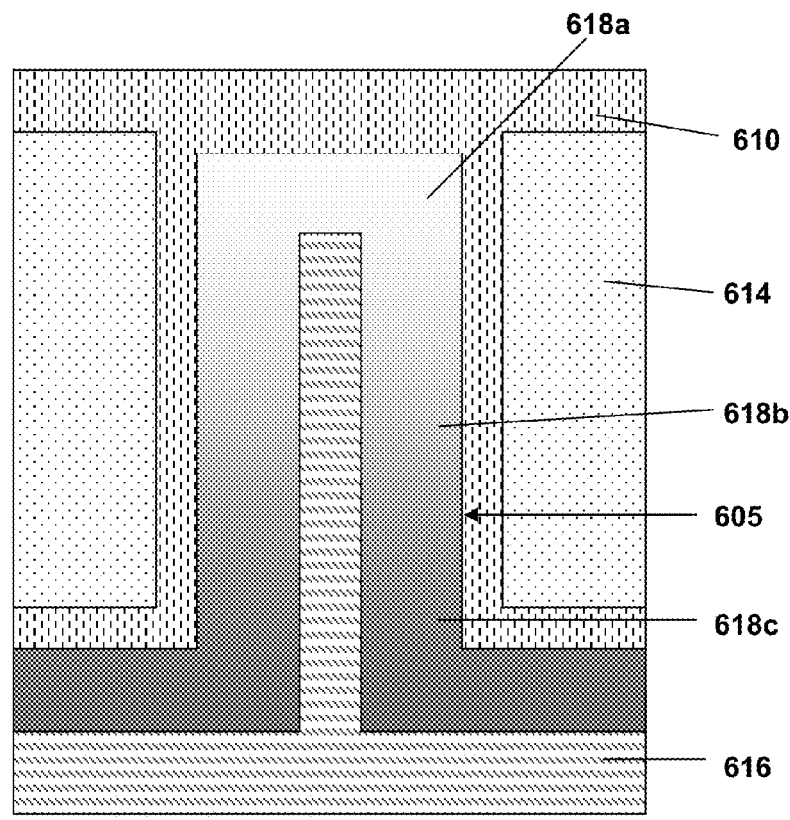
FIGS. 6a and 6b illustrate a cross-section of an energy conversion device according to an embodiment of the present invention.
Figure 6:
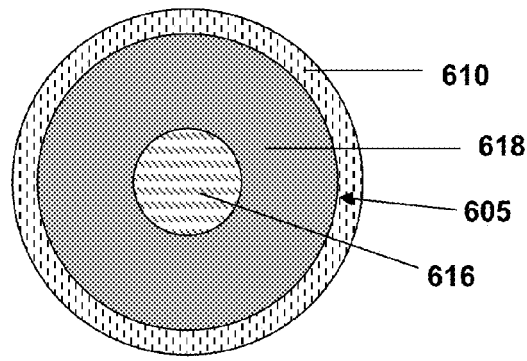

One embodiment of such a structure is illustrated in FIG. 6, where FIG. 6(a) illustrates a cross-sectional side view of a single pore channel having a substantially continuous and controlled compositional gradient and FIG. 6(b) illustrates a top view of the material rod. The coaxially disposed materials include a first conductor layer 616 that comprises a hole conductor material and forms a core in the pore channel and a second conductor layer 610 that comprises an optically transparent conductor and is disposed over the support member 614 forming an outermost shell within the pore channel. Disposed within the shell of the second conductor layer 610 within the pore channel is an energy conversion layer 605 that includes an absorber material 618. The absorber material 618 has a compositional gradient along the length of the pore channel such that a top portion 618a of the absorber material 618 has a different composition than a middle portion of the absorber material 618b, which in turn has a different composition than a lower portion of the absorber material 618c disposed near the bottom of the channel, leading to different material properties along the length of the pore channel, e.g., along the length of the material rod. For example, the portion 618a can have a band gap energy that is higher than the band gap energy of portions 618b and 618c. The compositional gradient of the absorber material 618 is preferably smooth and continuous along the length of the pore channel, e.g., along the length of the material rod.

Vertical grading of the band gap energy along the length of the pore channel can be accomplished in at least several ways. One method is to vary the material composition of the energy conversion layer along at least a portion of the length of the pore channel as illustrated in FIG. 6. For example, with $In_{1-x}Ga_xN$, the band gap energy can be varied continuously from 0.7 eV to 3.4 eV by varying the value of x. This band gap energy range provides an excellent fit to the solar spectrum. A compositionally graded energy conversion layer comprising $In_{1-x}Ga_xN$ that is Ga-rich at the top and In-rich at the bottom, and that varies along the pore channel in a substantially continuous manner, can be used to efficiently absorb most of the solar spectrum. Additionally, $In_{1-x}Ga_xN$ advantageously has a much higher resistance to ionizing radiation than other PV materials such as GaAs and GaInP.

The coaxially disposed material layers disclosed herein, including layers of materials with a vertically graded material composition (e.g., a vertically graded band gap energy) can be created inside the pore channels of a support member in a number of ways, such as by using Atomic Layer Deposition (ALD) to deposit one or more of the material layers. ALD, also known as atomic layer epitaxy, is a technique by which materials are deposited one atomic layer at a time. It is a technique capable of unprecedented levels of precision in terms of layer thickness and layer composition. It is also capable of conformal deposition of uniform layers within high surface area substrates with very high aspect ratio pore channels, such as AAO substrates. Furthermore, ALD can be also used to deposit material layers with a controlled composition and/or controlled thickness gradients, as described below.

In one method, diffusion-limited transport of reactive precursors (e.g., three or more reactive precursors) can be used to vertically grade the composition of one or more of the coaxial material layers, such as for a compositionally graded absorber material. For example, with closed pore channels on one surface of a support member (e.g., an AAO substrate), such as with a layer of transparent conductive oxide (TCO), and under conditions of diffusion limitations inside high aspect ratio pore channels, short ALD exposure will lead to the surface coverage decreasing with the pore channel depth. In this case, the surface sites may be first conformally saturated with one type of reactive surface species (designated as sites A, for example N—H from $NH_3$) using long exposures. Second, a short exposure of a second reactant B (e.g., trimethylgallium) that reacts with the surface species A may be used to create a vertically graded coverage terminated with sites B. Third, a long exposure of a third reactant C (e.g., trimethylindium) that reacts with unreacted sites A, but not with sites B, can be used to convert the remaining A sites into C sites. Then, a long exposure of the first reactant (e.g., $NH_3$) may complete a layer of material with graded composition ($In_{1-x}Ga_xN$ in this example, where the ratio of Ga/In decreases with the depth of the pore channels), and recovers the starting A surface.

In another method, by using the slow diffusion of gaseous precursors into high aspect ratio pore channels in the support member as described above, but using only one material, a thickness gradient of this material can be created inside the pore channel. A second material layer can then be grown on top of the first under conditions that are not limited by diffusion, thus creating a conformal layer of uniform thickness. Annealing of the two layers to enable chemical reaction or interdiffusion between the layers can produce a compositionally graded complex material.

Another method for creating graded compositions is to deposit 2 materials in the diffusion limited transport regime from opposite (e.g., exposed) sides of the support member to create a vertically graded composition.

Yet another approach for creating a compositional gradient along the pore channel is to create a conformal layer from one material with constant thickness and react this layer with a gaseous reagent(s) under conditions of limited diffusion into the pore channel to partially convert the initial material into another composition, with the degree of conversion being varied along the pore channel length as a result of the limited diffusion. Other approaches could be implemented using diffusion-limited transport in high aspect ratio pore channels.

In addition to ALD, active materials can be deposited into the pore channels using other techniques, either for vertically graded material layers or for vertically uniform material layers. Examples of other deposition techniques may include, but are not limited to, chemical vapor deposition (CVD), electroless deposition of metals, electrochemical deposition, vacuum deposition, as well as various coating techniques that can be used for polymeric materials.

Figure 7:
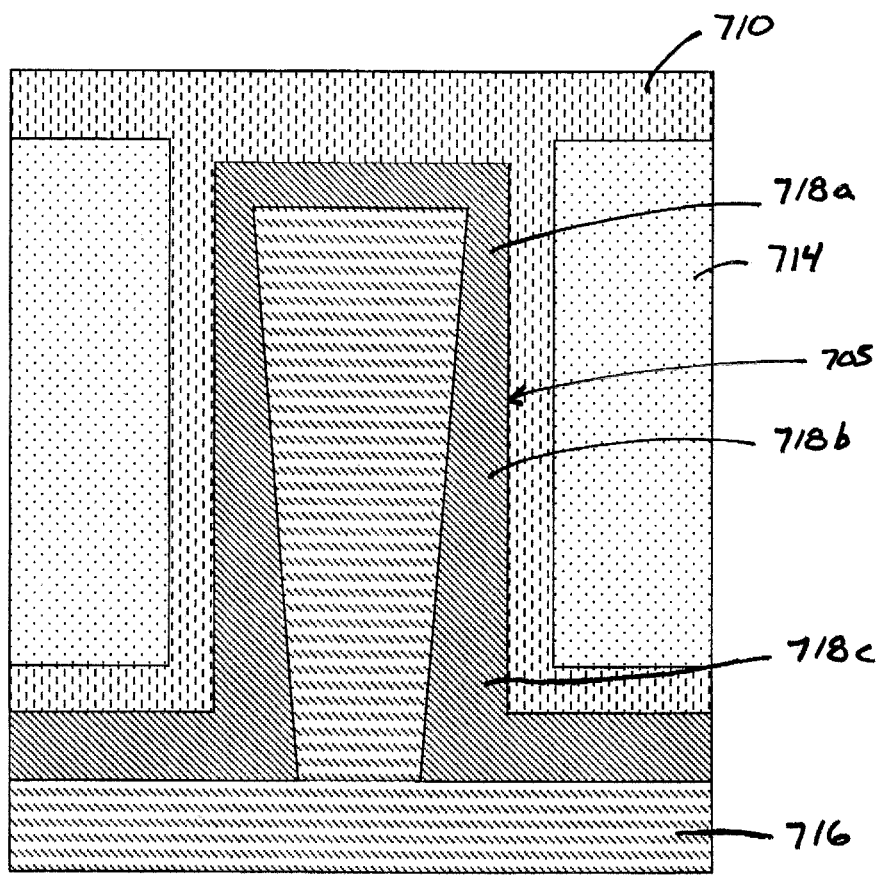
FIGS. 7a and 7b illustrate a cross-section of an energy conversion device according to an embodiment of the present invention.
Figure 7:
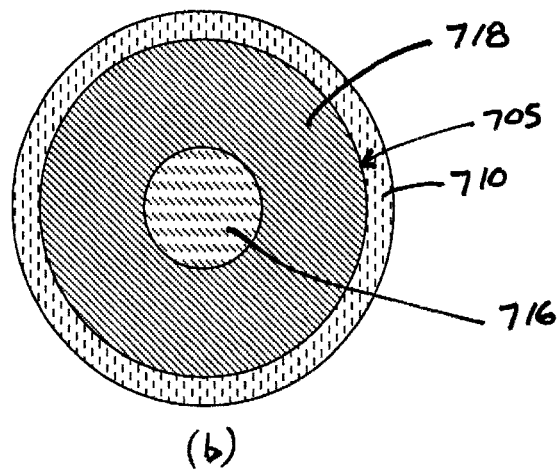

Another method of vertically grading the band gap energy along the length of the pore channel is by using quantum confinement effects within the pore channel, as is illustrated in FIG. 7, with FIG. 7(a) illustrating a cross-sectional side view of the pore channel and FIG. 7(b) illustrating a top view of the material rod. As illustrated in FIG. 7, the pore channel is contained within a support member 714 (e.g., AAO) and extends through the support member 714. A first conductor layer 716 forms a centrally disposed core within the pore channel that is surrounded by an energy conversion layer 705. The energy conversion layer 705 is in turn surrounded by a second conductor layer 710 that forms a shell around the energy conversion layer 705 within the pore channel.

In this embodiment, the energy conversion layer 705 comprises a semiconductor absorber material 718. When the thickness of the energy conversion layer 705 approaches the Bohr radius of the exciton (e.g., about 1.4 nm in ZnO), the band gap energy increases. A device structure with a very thin absorber material layer (e.g., with larger band gap energy) near the top 718a of the pore channel and a thicker absorber layer (e.g., with smaller band gap energy) near the bottom 718c of the pore channel can therefore be used to efficiently absorb most of the solar spectrum without significant thermalization losses. For example, the thickness may vary from a thickness of about 0.5 nm to about 5 nm near the top of the pore channel 718a to an increased thickness of about 10 nm to about 50 nm near the bottom 718c of the pore channel. The thickness preferably varies along the length of the pore channel in a smooth and continuous manner, as is illustrated in FIG. 7.

The absorber material 718 may have a small intrinsic band gap to utilize the greatest portion of the solar spectrum, such as an intrinsic band gap of not greater than about 1 eV. For example, InSb has an intrinsic band gap of 0.17 eV; if sufficiently small crystallites are created, the band gap energy can conceivably be increased to 3.2 eV, allowing ~93% of solar energy to be utilized. ALD can be used to create a well-controlled thickness gradient using the diffusion-limited surface coverage gradient with a single binary reaction, similar to the creation of composition gradients described above.

Figure 8:
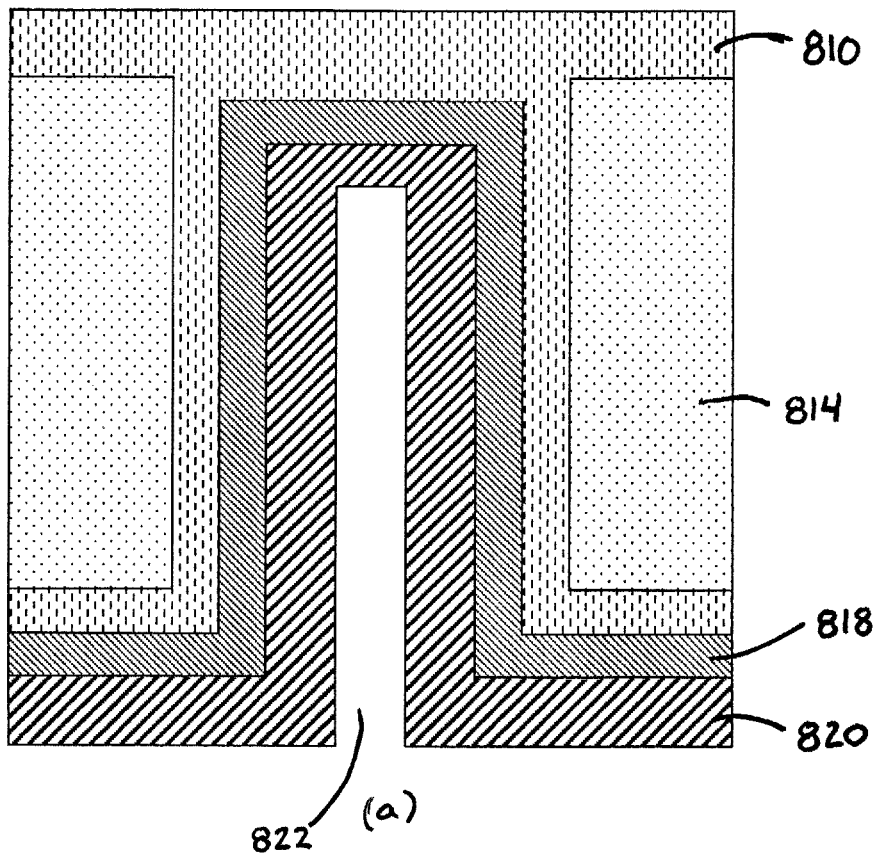
FIGS. 8a and 8b illustrate a cross-section of an energy conversion device according to an embodiment of the present invention.
Figure 8:
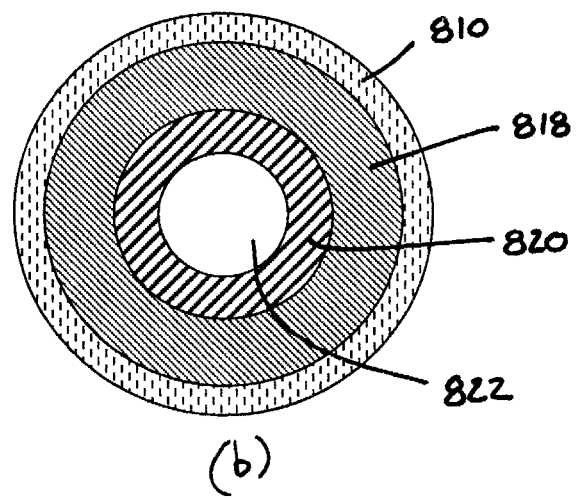

Similar to photovoltaic applications, photoelectrochemical (PEC) conversion ideally requires long pathlengths for light absorption and short pathlengths for charge separation. One example is the splitting of water into hydrogen and oxygen by sunlight. One such energy conversion device structure is illustrated in the embodiment of FIG. 8, where FIG. 8(*a*) illustrates a cross-sectional side view of a pore channel and FIG. 8(*b*) illustrates a top view of the material rod, which includes an exposed tube 822 coaxially disposed in center of the material rod. The device may thus include a high-density, high-surface-area array of exposed tubes 822 where the reactions can occur, e.g., where water is disposed within the tubes 822. For example, the tubes 822 may be defined by a photoelectrochemical material layer 820, such as one that comprises a photoelectrochemical material such as $TiO_2$ which is deposited conformally inside the pore channels of the support member 814. An energy conversion layer 818 comprising an absorber material may be disposed between the photoelectrochemical material layer 820 and a conductor layer 810, e.g., a conductor layer comprising a transparent conductor material, within the pore channel. The absorber material can be, for example, GaN or InN. In addition to $TiO_2$, the photoelectrochemical layer 820 could comprise, for example, other metal oxides such as tungsten oxide or iron oxide.

In this regard, the maximum carrier diffusion length is equal to the thickness of the energy conversion layer 818, which comprises the absorber material. Since the charge carriers only have to diffuse a short distance to reach a conductor layer 810, recombination losses may be greatly reduced. While reducing the charge carrier diffusion length, the structure may simultaneously ensure that a large absorption cross section is maintained, due to the length of the pore channels. In this way, the charge separation is decoupled from the light absorption, which can occur over the length of the pore channel through the use of an optically transparent conductor material for the conductor layer 810.

The structure illustrated in FIG. 8 may result in up to a 1000-fold increase of the surface area available for light absorption and electrochemical reactions, significantly increasing the hydrogen yield per unit area of the device. The approach also enables innovative band gap energy engineering to efficiently absorb the solar spectrum with increased hydrogen-production efficiency. There are several levels of implementation of the proposed approach: simple nanotube arrays; doped nanotubes with engineered band gap; doped nanotubes with a conductive shell; nanotubes with an absorber layer and a conductive shell The diameter of the tubes 822 is determined by the initial diameter of the pore channel and the amount of active material (e.g., layers 810, 818 and 820) deposited within the pore channels. For example, the tubes 822 can advantageously have an inner diameter of at least about 20 nm and not greater than about 500 nm. The length of the tube 822 is determined by the initial thickness of the support member 814. The contact will be made to one end of the photoelectrochemical material layer 820. The energy conversion layer may advantageously have a thickness of at least about 1 nm and not greater than about 20 nm, such as from about 5 nm to 10 nm to provide a short diffusion length for the charge carriers.

Such a structure can also incorporate gradients in one or more of the material layers, such as layer 820, in a manner similar to the embodiment illustrated in FIG. 6. For example, incorporating different amounts of carbon and/or nitrogen into the $TiO_2$ layer 820 along the length of the tube 822 can systematically vary the band gap energy of the $TiO_2$ along the length of the tube 822. By varying the amount of these dopants, the band gap energy can be tunable over a large range, possibly extending below 2.0 eV.

To reduce recombination losses and enable hydrogen production from water, the electrons must be effectively extracted from the $TiO_2$ layer 820 and sent to a cathode. By incorporating a conductor layer 810 comprising an optically transparent conductive oxide (TCO), recombination losses can be suppressed. The electrons will have only a short distance to diffuse to reach the conductive layer 810, where they will be effectively swept toward the cathode. TCOs are poor hole conductors; therefore, few holes will enter the TCO.

By incorporating an energy conversion layer 818 comprising an absorber material between the conductor layer 810 and the photoelectrochemical layer 820, a wider range of the solar spectrum can be absorbed. The absorber material can be selected to provide absorption of specific parts of the solar spectrum, or vertically graded to provide absorption across the entire solar spectrum. The electrons will enter the conductor layer 810 leaving the holes behind to diffuse to the $TiO_2$/electrolyte interface where they will be available for electrochemical reaction.

Similar structures to photoelectrochemical systems used for hydrogen generation such as that illustrated in FIG. 8 can be used for electromagnetic radiation driven water and air purification. For example, $TiO_2$ is known to oxidize organic compounds to $CO_2$ in the presence of UV radiation. Nanostructured $TiO_2$ with an integrated absorber layer can clean organics out of air and water in the presence of lower energy photons, which are absorbed by the absorbing material and provide their electron-hole pairs for chemical reaction at the $TiO_2$ surface.

Figure 9:
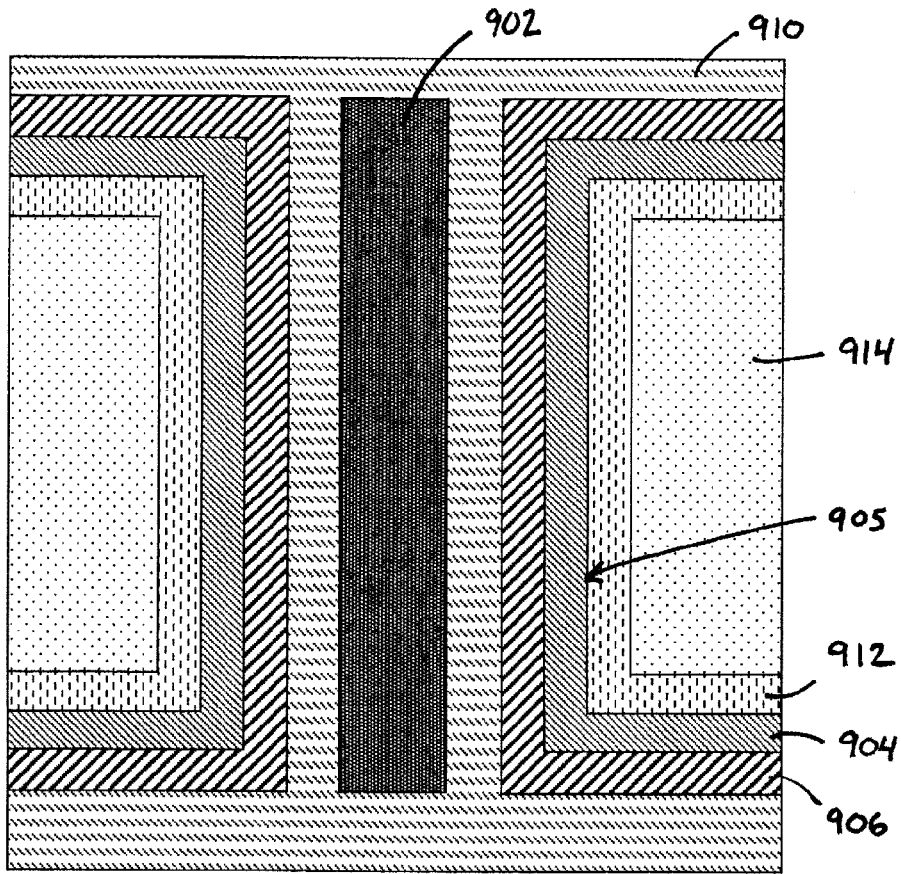
FIGS. 9a and 9b illustrate a cross-section of an energy conversion device according to an embodiment of the present invention.
Figure 9:
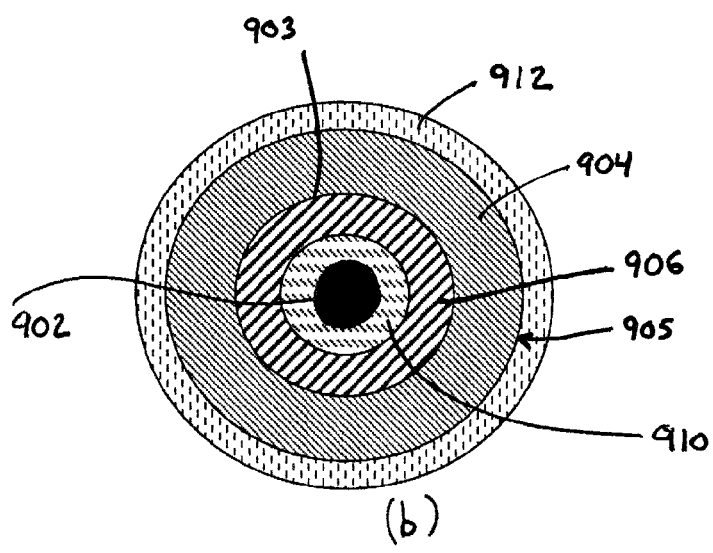

The energy conversion devices described herein can also be radiation detectors. Radiation detectors (e.g., alpha detectors and neutron detectors) utilizing the structures disclosed herein can provide detection efficiencies approaching 100% at substantially reduced cost. By way of example, a solid-state thermal neutron detector structure is illustrated in FIG. 9, where FIG. 9(*a*) illustrates a cross-sectional side view of a pore channel and FIG. 9(*b*) illustrates a top view of the material rod. The device may include high-density arrays of material rods formed within pore channels (see, e.g., FIG. 3). As illustrated in FIG. 9, the pore channel is contained within a support member 914 (e.g., AAO) and extends through the support member 914. A neutron convertor layer 902 is comprising a neutron converter material is centrally disposed within the pore channel, and is surrounded by a first conductor layer 910. The neutron converter material can be, for example, $^{10}B$ or $^6Li$, or can be a hydrogen containing material such as polyethylene. These materials absorb neutrons and release charged particles that can be detected in the energy conversion layer 905. The first conductor layer 910 is in turn surrounded by an energy conversion layer 905. A second conductor layer 912 is disposed between the energy conversion layer 905 and the support member 914. A contact may be made to this layer at either the front or back surface of the membrane by first attaching a contact material prior to deposition of the other material layers.

Thus, a core layer 902 of a neutron converter material such as $^{10}B$ is surrounded by an energy conversion layer 905. As illustrated in FIG. 9, the energy conversion layer 905 comprises an n-type semiconductor inner layer 906 and a p-type semiconductor outer layer 904. Each individual material rod is long in the direction of the incident neutrons, allowing for optimal neutron absorption, but thin in the orthogonal directions, minimizing alpha-particle absorption by the neutron conversion material and reducing the path length for the alpha particle to reach the p-n junction 903 between layers 904 and 906 (e.g., to detect all alpha particles generated), and thus provides a novel platform for low-cost high-performance detectors. The alpha particles (and Li ions) generated in the neutron conversion layer 902 are expected to have an isotropic distribution; therefore, most particles will exit the converter nanorod and pass through multiple p-n junctions in the outer shells. The charged particles will create electron-hole pairs inside the depletion layer of all the p-n junctions through which they pass. Alternatively, instead of a p-n junction, a Schottky diode can be used for the energy conversion layer by placing a semiconducting material in direct contact with a metal.

This design can improve efficiency by including conductive coatings 910 and 912 both inside and outside the p-n junction shells. In this design, defects in the semiconductor are much less important, since the carriers have to diffuse only a very short distance before entering the conductor. Additionally, because the p-n junctions are very thin, only a very small voltage will be required to completely deplete the junction. Therefore, this detector is expected to consume much less power than traditional solid state detectors (e.g., FIG. 1).

One persistent problem with solid state detectors is false positives due to gamma radiation. In order to differentiate between neutrons and gamma-rays, a reference gamma-ray detector can be provided by excluding the $^{10}$B nanorod core, thus enabling only gamma-ray detection. By comparing the signal from the two regions, gamma radiation can be identified and false positives eliminated from the thermal neutron signal.

The cross-section for a fast neutron to react with the $^{10}$B (or $^6$Li) is very small, and the efficiency for this device becomes very low. In order to detect fast neutrons with reasonable efficiency, a moderator would have to be used to thermalize the neutrons. However, all neutron energy information would be lost by using a moderator.

To enable fast neutron detection, a boron neutron conversion material can be replaced with a hydrogen containing material such as polyethylene (PE) to provide a detectable signal using recoiled protons. Additionally, a Schottky diode can be used instead of a p-n junction diode in the energy conversion layer by putting a semiconductor in contact with a metal. Neutrons undergo a series of elastic collisions with the hydrogen atoms in a polymer producing multiple protons per neutron. By measuring the total energy of all the protons produced by the neutrons, the initial energy of the neutron can be deduced. Therefore, this design can advantageously be used for spectroscopic applications. Preliminary calculations suggest that a 200 µm thick detector incorporating polyethylene nanorods may have an efficiency comparable to or exceeding that of a 15 cm unmoderated $^3$He neutron detector in the energy range of 100 keV to 4 MeV. The detection efficiency may range from ~0.5% at 100 keV to ~0.1% at 4 MeV. Further increases in efficiency can be gained by applying a layer of polyethylene on top of the detector, at the cost of losing some low energy neutron signals.

As is noted above, the p-n junction may be replaced by a Schottky diode in order to increase the operational frequency of the device. For example, the junction may be formed between a conductive gold shell and semi-insulating (SI) GaN n-type GaN and an ohmic contact can complete the circuit.

Figure 10:
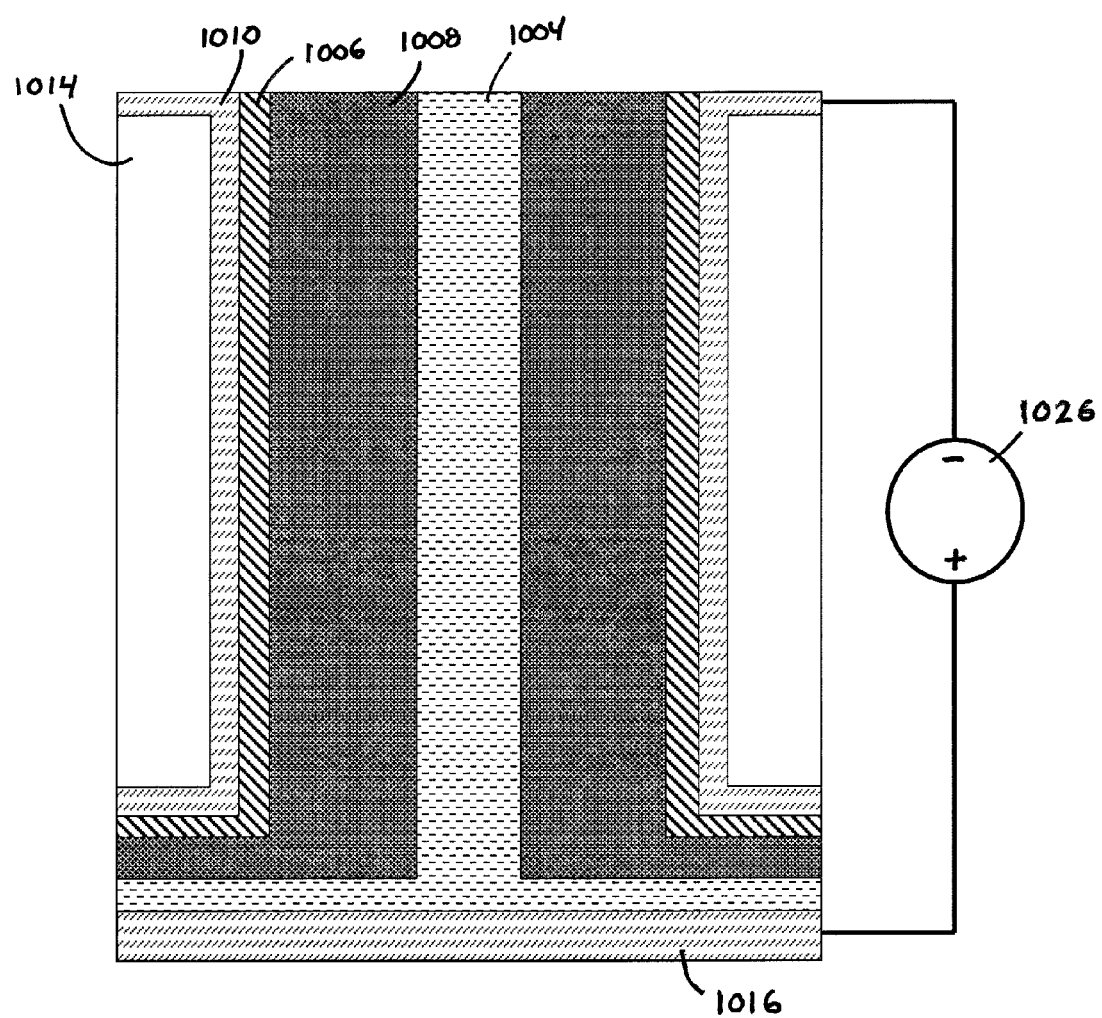
FIG. 10 illustrates a cross-section of an energy conversion device according to an embodiment of the present invention.

The energy conversion devices of the present invention can also include high-efficiency, low-cost, long-lifetime, and large area lighting devices such as LEDs with emission wavelengths that may range from UV to IR. One exemplary design of a single pore channel (e.g., a material rod) that can be utilized in an array to form an LED is illustrated in FIG. 10, where a cross-section of a pore channel having active material layers deposited therein is illustrated. The LED material layers comprise four separate coaxial layers inside a support member, e.g., a support member of AAO.

By way of example, for UV LEDs, an inner layer 1004 of p-type GaN may be surrounded by a coaxial material layer 1008 (e.g., a shell) of InAlGaN, which is in turn surrounded by a layer 1006 of n-type GaN. This structure is surrounded by a conductor layer 1010 of a conductive and optically transparent material, such as indium tin oxide. The coaxial material rod LED structure can yield very high quantum efficiencies when a bias voltage 1026 is applied to the structure. The outer conductor layer 1010 of conductive metal oxide, which extends along the length of the pore channel, allows the entire length of the material rod to be effectively addressed for light generation without the need for a metallic contact on top of the structure. Furthermore, application of the bias voltage 1026 (e.g., an electric field) substantially perpendicular to the length (e.g., the long axis) of the material rod may blue-shift the emission compared to electric fields that are applied parallel to the long axis.

Figure 11:
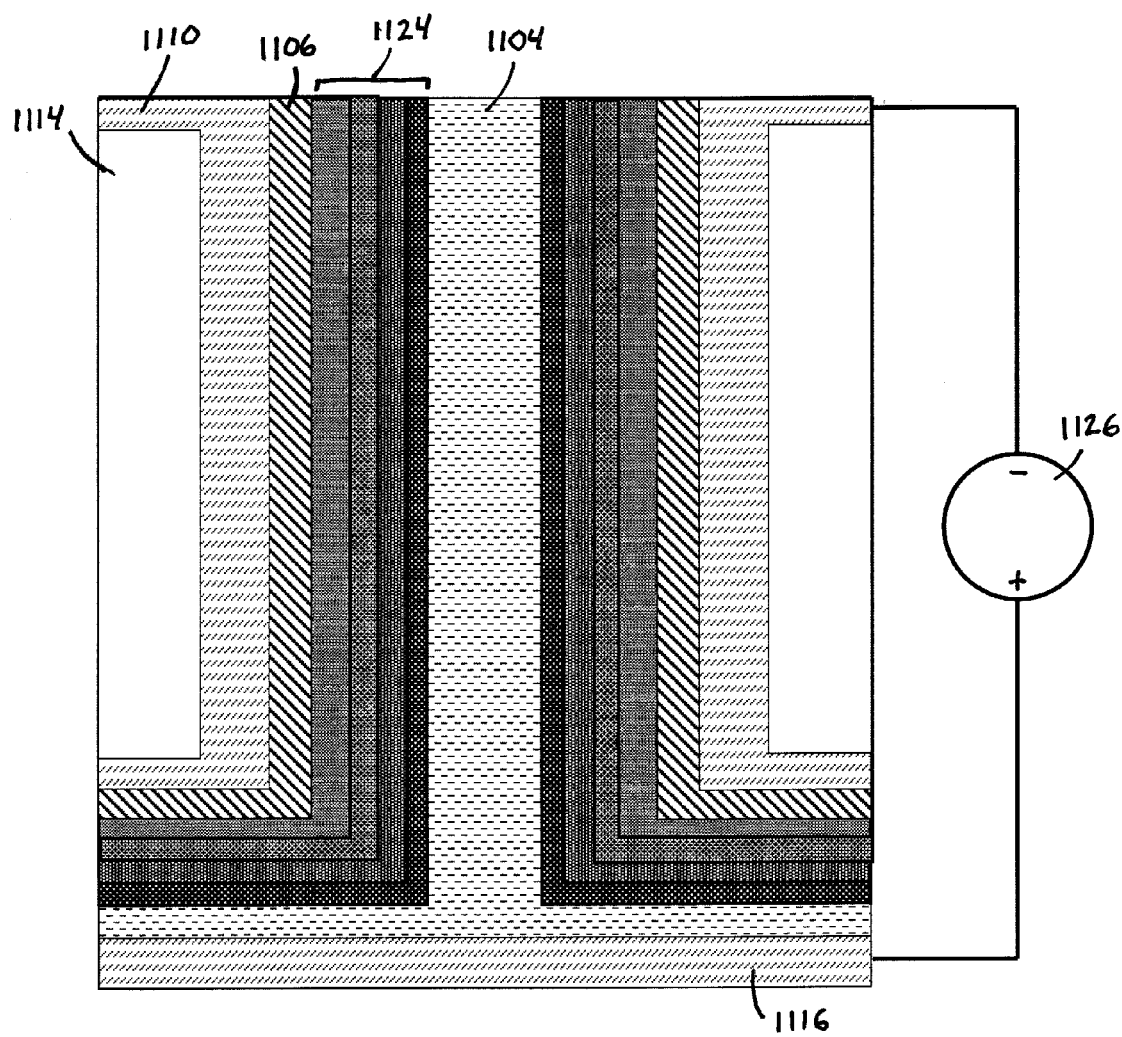
FIG. 11 illustrates a cross-section of an energy conversion device according to an embodiment of the present invention.

FIG. 11 illustrates a cross-sectional side view of another structure for an LED. As illustrated in FIG. 11, the pore channel is contained within a support member 1114 (e.g., AAO) and extends through the support member 1114. A first p-type semiconductor layer 1104 forms a centrally disposed core within the pore channel that is surrounded by a multiple quantum well (MQW) layer 1124. The MQW layer 1124 is in turn surrounded by a layer of n-type semiconductor 1106. A second (e.g., optically transparent) conductor layer 1110 is disposed between the support member 1114 and layer 1106 of n-type semiconductor.

As compared to the embodiment illustrated in FIG. 10, the single InAlGaN layer (1008 in FIG. 10) is replaced with a layer 1124 comprising multiple quantum wells. Deep ultraviolet emissions below 230 nm have been demonstrated for 5-period AlN/Al$_{0.85}$Ga$_{0.15}$N MQWs. When a bias voltage 1126 is applied, this structure may advantageously reach emission wavelengths below 280 nm.

LEDs having such a material rod structure have a distinct advantage over traditional LEDs, especially in applications that require large LED area, such as water purification by application of UV radiation. The material rods produced in a support member as described herein will be inherently aligned and supported within the matrix of the support member, providing a straightforward route for integration into functional devices. The active area of the LED material rod array will be determined by the area of the support member used. In addition to LEDs, similar structures may be used for white light solid-state lighting systems. For example, phosphorescent materials can be incorporated down the center of a UV LED tube to produce a wide spectrum of colors and to produce white light. In addition, by substituting GaN for semiconductors with smaller bandgaps, LEDs can be created for a wide variety of wavelengths.

One advantage of the foregoing structures in energy conversion applications is that they are inherently scalable and the material rods are produced in an aligned fashion. The manufacture can be based on using anodic metal oxides, e.g. AAO, as a template to build up the material rod arrays by material deposition into the pore channels. The manufacture of AAO has been utilized to make substrates in excess of 1 m². The material layers can be deposited inside the AAO template using atomic layer deposition (ALD), which is inherently scalable for manufacturing of large numbers of devices over large area substrates in a batch type process.

Energy conversion structures may also implemented with AAO that have pores closed on one side (e.g., before separating it from the aluminum substrate), by consecutive deposition of coaxial layers of materials and providing all contacts on one side.

In order to avoid potential problems with powering large area devices from a single power source, or to properly segment the solar panels, the contact layer on the surfaces of the AAO support member may be lithographically defined so that the resulting large monolithic panel consists of multiple individual elements. This can allow proper power management to be applied to integrate each individual element.

EXAMPLES

Having described the invention, the following examples are given to further illustrate the invention. These examples are for purposes of illustration and are not intended to limit the scope of the invention described herein.

Example 1

Blank Nanoporous Support Member

Blank nanoporous anodic aluminum oxide (AAO) support members are prepared in-part as described in U.S. Pat. No. 6,705,152 and U.S. Patent Publication No. 2007/0256562, which are each incorporated herein by reference in its entirety. In this example, AAO is formed using at least 98% pure Al foil. Optionally, prior to anodization, the foil can be rolled and pressure-annealed at about 350° C. and 5,000 psi for 20 min to improve its surface quality, achieve required thickness and reduce stress in the finished AAO support member. Al foil is anodized on both sides in 1% oxalic acid electrolyte at a temperature of 2° C. and anodization voltage of 100V (and as high as 300-400V in different electrolytes), until a charge density of about 2° C./cm² is accumulated, to form a sacrificial AAO layer. The sacrificial AAO layer can improve surface quality and pore channel ordering in the final AAO support member.

The resulting sacrificial layer of about 10 μm of AAO is then stripped in a hot solution of 200 g/l chromic oxide in 50% phosphoric acid, the Al substrate is rinsed and dried, and an adhesion layer of AAO having a thickness of 0.5 μm is grown using the same conditions. To define the shape and size of the support members, Al is patterned by applying conventional photoresist to both sides of the Al substrate. The substrate is soft-baked at 90° C. for 20 min and exposed to a UV light using a mask with the openings of required size and format, in this case, 13 mm circular membranes. Final anodization is carried out in 1% oxalic acid electrolyte at temperature of 2° C. and anodization voltage of 100V until a charge density of about 10° C./cm² is accumulated, corresponding to a 50 μm thick AAO substrate with an average pore channel diameter of about 85 nm and a porosity of about 10%.

The AAO substrate is still attached to the surface of the Al foil with the pore channels open on one side. It is referred to as "AAO on Al" and can be used as-is as a support member for fabrication of some of the energy conversion devices described herein.

Another type of AAO support member used herein is formed by separating the AAO from the Al foil to provide access to the pore channels from both sides of the AAO and is referred to as a "free-standing" AAO support member. It is prepared by electrochemical separation of AAO from Al in a solution of concentrated perchloric acid and acetic anhydride at a cathodic bias of about 5 V to 10 V above the anodization voltage.

The pore diameter and porosity in both types of AAO substrates can be increased by slow chemical dissolution of the alumina from the pore channel walls for up to about 120 min in a solution of 0.5M phosphoric acid.

At an anodization voltage of 100 V, an etch time of 60 min results in a final average pore channel diameter of about 250 nm. The resulting substrates are rinsed, dried and are then ready for the deposition of the active material layers. When needed, the AAO can be annealed to above 850° C. to form gamma-alumina, or up to 1100° C. to form alpha-alumina. Blank support membranes with an overall diameter as large as 150 mm are produced in this example.

Example 2

Arrays of Conductor Layers

Free-standing porous AAO support members are prepared as described in Example 1. Conductive material layers are grown by deposition of $Al_2O_3$-doped ZnO inside the pore channels using an atomic layer deposition (ALD) reactor. The ALD reactor is evacuated to less than 100 mTorr and heated to 110° C. and alternating gasses are injected into the ALD reactor.

In this regard, alumina is deposited on a free-standing 13 mm AAO support member by injecting trimethylaluminum (TMA) into the statically sealed ALD reactor to a total pressure of about 1 torr and holding it over the AAO substrates for 2 minutes. Then the gate valve is opened and the TMA is evacuated from the ALD reactor. After evacuation, ultrapure nitrogen is flowed through the reactor for 30 seconds and subsequently evacuated again to ensure removal of all unreacted TMA. The reactor is then filled with about 1 torr of water for 2 minutes, and is subsequently evacuated and again purged with nitrogen. Repeating this process 5 times produces a ~0.6 nm thick layer of alumina inside the pore channels of AAO and provides a starting surface for further processing.

On top of the starting surface of alumina, ZnO is deposited using diethylzinc (DEZ) and water in the same manner as alumina is deposited using TMA and water. After 17 cycles (~3 nm) of ZnO deposition, a single cycle of alumina (~0.1 nm) is deposited. Then the 17 cycles of ZnO plus 1 cycle of alumina is repeated as many times as necessary to achieve the desired conductive material layer thickness. These material layers are conductive, resulting in a resistance of less than 0.01 ohm across the 13 mm×0.05 mm volume.

Example 3

Coaxial Array Capacitor

A capacitor is formed by sequential deposition of coaxial conductive and dielectric material layers inside the pore channels of AAO. Conductive material arrays are prepared as described in Example 1. Conductive material layers with a wall thickness of about 19 nm are prepared by repeating the 17 cycles of ZnO plus 1 cycle of alumina sequence 6 times (see Example 2). A gold contact is sputtered on one side of the support member, and a conductive wire is attached using conductive epoxy.

A dielectric material is then deposited to form a dielectric material layer on top of the first conductive layer within the pore channels. Alumina is used as the dielectric material, which is deposited in the same manner as the alumina deposition described in Example 2. By depositing 50 cycles of alumina, a material layer of ~6 nm thickness is deposited. To form a second conductive layer to complete the capacitor structure, another deposition of a conductive $Al_2O_3$-doped ZnO material layer is performed on top of the dielectric layer, using 17 cycles ZnO plus 1 cycle alumina repeated 6 times. A second contact is sputtered on the opposite side of the support member from the first contact and a conductive wire is attached using conductive epoxy creating a complete capacitor structure. This structure exhibits a capacitance at least 2 orders of magnitude greater than a planar capacitor of the same footprint made from the same materials.

Example 4

Photovoltaic Array Device

After sputtering a 3 µm layer of a transparent and conductive contact from indium tin oxide (ITO) on one side of an AAO support member, a conductive material rod array (wall thicknesses of ~19 nm) is prepared as described in Example 2 by repeating the 17 cycles of ZnO plus 1 cycle of alumina sequence 6 times. A gold contact grid is sputtered onto the ITO, and a conductive wire is attached using conductive epoxy.

ALD deposition of a GaN absorber material is then used to conformally coat the inside of the Al:ZnO material layers within the pore channels of the AAO, using 50 alternating doses of trimethylgallium and hydrazine at 350° C. Following this deposition, a conductive core within the resulting coaxial material layers is created using a commercially available hole-conducting polymer Oligotron™ (poly(3,4-ethylenedioxythiophene), tetramethacrylate end-capped in nitromethane), available from TDA Research of Wheat Ridge, Colo., USA. The polymer is deposited by spin-coating from solution. DC sputtering is used to deposit a layer of gold on top of the hole-conducting polymer. This gold layer is used as the final contact material for the holes and a contact wire is attached using conductive epoxy. The resulting structure is a functional material rod array photovoltaic device.

Example 5

Photovoltaic Array Device with Graded Band Gap

After sputtering a 3 micron layer of a transparent and conductive contact from indium tin oxide (ITO) on one side of an AAO support member, a conductive material layer within the pore channels (wall thicknesses of ~19 nm) is prepared as described in Example 2 by repeating the 17 cycles of ZnO plus 1 cycle of alumina sequence 6 times. A gold contact grid is sputtered onto the ITO, and a conductive wire is attached using conductive epoxy.

Next, ALD deposition is used to deposit an InN absorber material layer inside of the Al:ZnO material layers within the pore channels of the AAO, using alternating doses of trimethylindium and hydrazine at 250° C. By running the ALD reaction in non-saturating conditions, a thickness gradient is achieved where the absorber material layer is thicker at the opening of the pore channels, and thinner at bottom of the pore channels (e.g., towards the ITO contact). Sufficiently thin absorber material layers display an increased band gap energy due to quantum confinement effects. Thus, the InN material layer with the thickness gradient along the pore channel length can achieve a band gap energy that is large near the ITO surface, and decreases to the bulk value towards the pore channel entrance.

Following this deposition, a conductive material layer forming a core within the resulting absorber material layer is created using a commercially available hole-conducting polymer Oligotron™ (poly(3,4-ethylenedioxythiophene), tetramethacrylate end-capped in nitromethane). The polymer is deposited by spin-coating from solution. DC sputtering is used to deposit a layer of gold on top of the hole-conducting polymer layer. This gold layer is used as the final contact material for the holes. A contact wire is attached using conductive epoxy. The resulting structure is a functional material rod array photovoltaic device.

Example 6

Photovoltaic Array Device with Composition Graded Band Gap

After sputtering a 3 micron layer of a transparent and conductive contact from indium tin oxide (ITO) on one side of an AAO support member, a conductive material tube array (wall thicknesses of ~19 nm) is prepared as described in Example 2 by repeating the 17 cycles of ZnO plus 1 cycle of alumina sequence 6 times. This seals the pore channels on the side of the AAO with the ITO deposited on it. A gold contact grid is sputtered onto the ITO, and a conductive wire is attached using conductive epoxy.

Next, ALD deposition is used to deposit an absorber material layer with a vertically graded composition inside of the Al:ZnO material tubes within the pore channels of the AAO. The compositionally graded material layer is deposited by exposing the surface to hydrazine at 250° C. The N—H functionalized surface is then exposed to trimethylindium (TMI) at 250° C. in a regime where the TMI is diffusion-limited into the pores and only a fraction of the pore is exposed to TMI. The surface exposed to TMI is methyl-terminated.

Next the structure is heated to 350° C. using an in-situ resistive heater and exposed to a long dose of trimethylgallium (TMG). The TMG is allowed to diffuse all the way into the pore channels and reacts with any surface sites not already coated with TMI. Then the sample is cooled back to 250° C. before being exposed again to hydrazine. This cycle sequence is repeated as many times as needed to produce a sufficiently thick layer of ternary material. By varying the length of the TMI exposure during different cycles, a conformal coating of $In_{1-x}Ga_xN$ with very precisely and gradually graded composition is achieved. In this example, the ratio of Ga/In in $In_{1-x}Ga_xN$ decreases with the depth of the pores, resulting in an absorber material layer with the band gap continuously varied along the pore length (from high at the bottom to low at the entrance of the pore).

Following this deposition, a conductive core within the resulting material tube is created, using, for example, a commercially available hole-conducting polymer Oligotron™ (poly(3,4-ethylenedioxythiophene), tetramethacrylate end-capped in nitromethane). The polymer is deposited by spin-coating from solution. DC sputtering is used to deposit a layer of gold on top of the hole-conducting polymer. This gold layer is used as the final contact material for the holes. A contact wire is attached using conductive epoxy. The resulting structure is a functional material rod array photovoltaic material.

Example 7

Photocatalytic Array Device

A conductive material tube array is prepared as described in Example 2. DC sputtering is used to deposit a conductor layer of gold on one side of the support member and a conductive wire is attached using conductive epoxy. Next, ALD deposition of $TiO_2$ is used to conformally coat the inside of the Al:ZnO coated pore channels of the AAO using 50 alternating doses of titanium isopropoxide and water at 200° C., forming $TiO_2$ material layers (e.g., tubes) inside the conductive material layers. The backside of the material tube array, with the gold contact and conductive wire, is encapsulated using silicone adhesive, and the other side of the AAO support member includes exposed Al:Zno\$TiO_2$ material tubes. These materials are shown to photochemically (in the absence of applied potential) and photoelectrochemically (in a broad range of applied potential) cleave water to hydrogen and oxygen upon exposure to light from a xenon arc lamp. The photocurrent for a material tube array photocatalyst is at least 25 times greater than the photocurrent for a planar sample made from the same materials.

Example 8

Charged Particle Detector Array Device

Blank AAO support members are prepared as described in Example 1. Gold conductor layers are deposited by an electroless gold deposition method. This method involves modification of the AAO surface using a silane derivative (3-(Succinic anhydride)propyl trimethoxysilane; "SAPT"). After AAO surface modification with SAPT, the surface is activated via sequential immersion in solutions of $SnCl_2$ and of $AgNO_3$ and $NH_4^+$. This forms a catalytic surface containing metallic silver particles, which promotes deposition of gold from a commercial gold plating solution obtained from Technic, Inc., Cranston, R.I., USA. A gold contact is then deposited onto one side of the membrane by DC sputtering and a conductive wire is attached using conductive epoxy.

A p-type ZnO semiconductor layer is deposited using ZnO ALD modified with ammonia ($NH_3$). By exposing the sample to $NH_3$ after each ALD cycle, nitrogen is incorporated into the growing films, as confirmed by a blue-shift in the band gap. Fifty cycles of nitrogen-doped ZnO (p-type semiconductor) are grown on the gold layer. Next, 50 cycles of undoped ZnO (n-type semiconductor) are deposited to complete the coaxial p-n junction within the pore channels. Finally, conductive aluminum-doped ZnO is deposited as the inner (electron-conducting) conductor layer. A gold layer is sputtered on the membrane side opposite the first gold layer and a conductive wire is attached using conductive epoxy to form the charged particle detector.

Example 9

Neutron Detector Array Device

A material rod array charged particle detector is fabricated as described in Example 7 As a final step, boron is deposited inside the material tubes from a solution of potassium dodecahydrododecaborate hydrate ($K_2B_{12}H_{12} \cdot xH_2O$) by soaking the sample for 5 minutes in 0.45M aqueous solution at room temperature, removing the excess solution and allowing the sample to air dry. This is repeated four times. SEM/EDX cross-sectional analysis shows material deposited conformally inside the pore channels.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. An energy conversion device, comprising:
   a support member comprising an array of pore channels, the pore channels having an average pore channel diameter of not greater than about 10 μm and having a pore channel length; and
   a plurality of material layers coaxially disposed along the length of the pore channels, the material layers comprising:
   a first conductor layer;
   a second conductor layer; and
   an energy conversion layer including at least a first energy conversion material and a second energy conversion material, wherein the first energy conversion material is a p-type semiconductor and the second energy conversion material is an n-type semiconductor, wherein the first conductor layer is coaxially disposed within a shell of the first energy conversion material, wherein the first energy conversion material is coaxially disposed within a shell of the second energy conversion material, wherein the second energy conversion material is disposed within a shell of the second conductor layer.

2. An energy conversion device as recited in claim 1, wherein the support member is anodic aluminum oxide.

3. An energy conversion device as recited in claim 1, wherein the average pore channel diameter is at least about 1 nm and is not greater than about 1000 nm.

4. An energy conversion device as recited in claim 1, wherein the pore channel length is at least about 0.1 μm and is not greater than about 500 μm.

5. An energy conversion device as recited in claim 1, wherein the energy conversion layer has a thickness of at least about 1 nm and not greater than about 200 nm.

6. An energy conversion device as recited in claim 1, wherein the support member has a pore channel density of at least about $10^8$ pore channels per $cm^2$ and not greater than about $10^{10}$ pore channels per $cm^2$.

7. An energy conversion device as recited in claim 1, wherein the pore channels extend through the support member.

8. An energy conversion device as recited in claim 1, wherein the first conductor layer comprises a hole conductor material.

9. An energy conversion device as recited in claim 1, wherein the second conductor layer comprises an optically transparent electrically conductive material.

10. An energy conversion device as recited in claim 9, wherein the energy conversion layer comprises a p-n junction disposed between the second conductor layer and the first conductor layer.

11. An energy conversion device as recited in claim 9, wherein the energy conversion layer comprises a Schottky junction disposed between the second conductor layer and the first conductor layer.

12. An energy conversion device as recited in claim 9, wherein the energy conversion device is a photovoltaic device.

13. An energy conversion device as recited in claim 1, wherein the energy conversion device is a radiation detector.

14. An energy conversion device as recited in claim 13, wherein the plurality of material layers further comprises a neutron converter layer disposed within a shell of the first conductor layer.

15. An energy conversion device as recited in claim 14, wherein the neutron converter layer comprises a material selected from the group consisting of $^{10}B$, $^{6}Li$ and polyethylene.

16. An energy conversion device as recited in claim 1, wherein the energy conversion device is a light emitting diode.

17. An energy conversion device as recited in claim 16, wherein the energy conversion layer comprises a layer of n-type semiconductor and a layer of p-type semiconductor, and wherein the second conductor layer comprises an optically transparent electrically conductive material.

18. An energy device as recited in claim 16, wherein the energy conversion layer comprises a multiple quantum well structure.

19. A method for the fabrication of an energy conversion device, comprising the steps of:

providing a support member comprising an array of pore channels, the pore channels having an average pore diameter of not greater than about 10 μm and having a pore channel length;

depositing at least a first material layer within the pore channels to coat an interior surface of the pore channels and form a first material layer within the pore channels, wherein the first material layer comprises a first conductive material;

depositing a second material layer within the first material layer, wherein the second material layer is coaxially disposed within the first material layer, wherein the second material layer comprises at least a first energy conversion material, and wherein the first energy conversion material comprises an n-type semiconductor;

depositing a third material layer within the second material layer, wherein the third material layer is coaxially disposed within the second material layer, wherein the third material layer comprises at least a second energy conversion material, and wherein the second energy conversion material comprises a p-type semiconductor; and depositing a fourth material layer within the third material layer, wherein the fourth material layer is coaxially disposed within the third material layer, and wherein the fourth material layer comprises a second conductive material.

* * * * *